United States Patent [19]

Elgamal et al.

[11] Patent Number: 4,758,745
[45] Date of Patent: Jul. 19, 1988

[54] USER PROGRAMMABLE INTEGRATED CIRCUIT INTERCONNECT ARCHITECTURE AND TEST METHOD

[75] Inventors: Abbas Elgamal, Palo Alto; Khaled A. El-Ayat, Cupertino; Amr Mohsen, Saratoga, all of Calif.

[73] Assignee: Actel Corporation, Sunnyvale, Calif.

[21] Appl. No.: 909,261

[22] Filed: Sep. 19, 1986

[51] Int. Cl.$^4$ .......................................... H03K 17/693
[52] U.S. Cl. ................................... 307/465; 307/468; 307/584; 340/825.84; 340/825.91
[58] Field of Search ...................... 307/202.1, 465–469, 307/572, 577, 579, 584, 585, 443, 446, 303; 364/491, 716; 340/825.22, 825.83, 825.84, 825.91; 365/72, 96, 163

[56] References Cited

U.S. PATENT DOCUMENTS

| | | | |
|---|---|---|---|
| 4,207,556 | 6/1980 | Sugiyama et al. | 307/467 X |
| 4,399,372 | 8/1983 | Tanimoto et al. | 307/449 X |
| 4,433,331 | 2/1984 | Kollaritsch | 364/716 X |
| 4,455,495 | 6/1984 | Masuhara et al. | 307/465 X |
| 4,543,594 | 9/1985 | Mohsen et al. | 307/202.1 X |
| 4,609,986 | 9/1986 | Hartmann et al. | 364/716 X |
| 4,642,487 | 2/1987 | Carter | 307/465 |

FOREIGN PATENT DOCUMENTS 2556275  7/1976 Fed. Rep. of Germany ...... 307/468

OTHER PUBLICATIONS

Greenspan et al., "Merged AND/OR Array PLA Using Double Polysilicon FET Process", IBM T.D.B., vol. 23, No. 6, Nov. 1980, pp. 2189–2191.
Balasubramanian et al., "Program Logic Array with Metal Level Personalization", IBM T.D.B., vol. 19, No. 6, Nov. 1976, pp. 2144–2145.
Conrad et al., "Programmable Logic Array with Increased Personalization Density", IBM T.D.B., vol. 19, No. 7, Dec. 1976, pp. 2628–2629.

*Primary Examiner*—Stanley D. Miller
*Assistant Examiner*—D. R. Hundspeth
*Attorney, Agent, or Firm*—Lyon & Lyon

[57] ABSTRACT

A user-programmable interconnect architecture, which may be used for logic arrays for digital and analog system design, is disclosed. In one embodiment, a plurality of logic cells or modules in a matrix are connected by vertical and horizontal wiring channels. The wiring channels may in turn be programmed by the user to interconnect the various logic cells to implement the required logic function. The wiring channels comprise wiring segments connected by normally open programmable elements situated at the intersection of any two segments to be connected. Sensing circuitry and wiring may be included to allow 100% observability of internal circuit nodes, such as module outputs, from an external pad interface.

22 Claims, 13 Drawing Sheets

| LOGIC FUNCTIONS TO BE REALIZED | UNIVERSAL MODULE | | | | |
|---|---|---|---|---|---|
| | INPUT CONNECTIONS | | | OUTPUTS | |
| | S | A | B | $\overline{Q}$ | Q |
| NAND / AND | X | Y | '0' | $\overline{X \cdot Y}$ | $X \cdot Y$ |
| NOR / OR | X | '1' | Y | $\overline{X+Y}$ | $X+Y$ |
| XNOR / XOR | X | $\overline{Y}$ | Y | $X \cdot Y + \overline{X} \cdot \overline{Y}$ | $X \cdot \overline{Y} + \overline{X} \cdot Y$ |
| SR / LATCH | $\overline{Q}$ | S | $\overline{R}$ | $\overline{Q}$ | Q |
| D / LATCH | L | D | Q | $\overline{Q}$ | Q |

FIGURE 2C

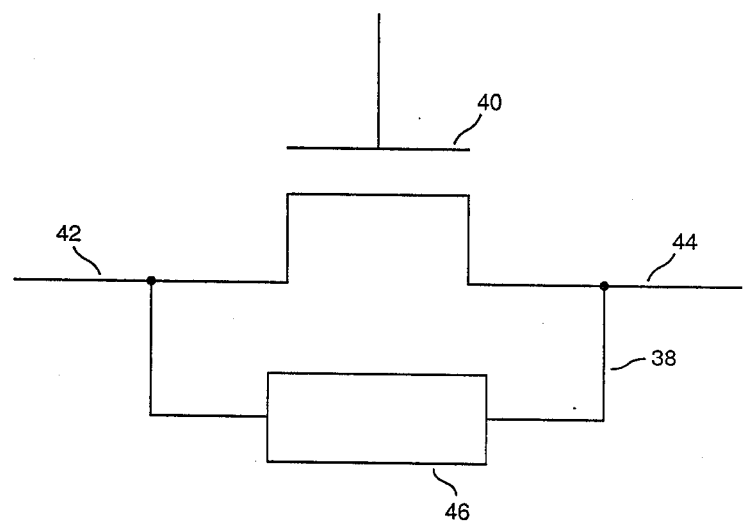

FIGURE 3

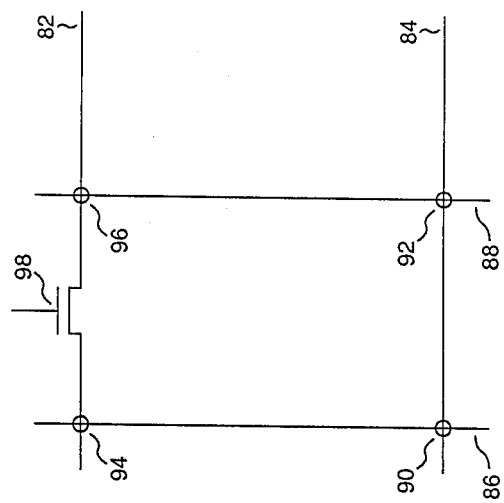
*FIGURE 7E*
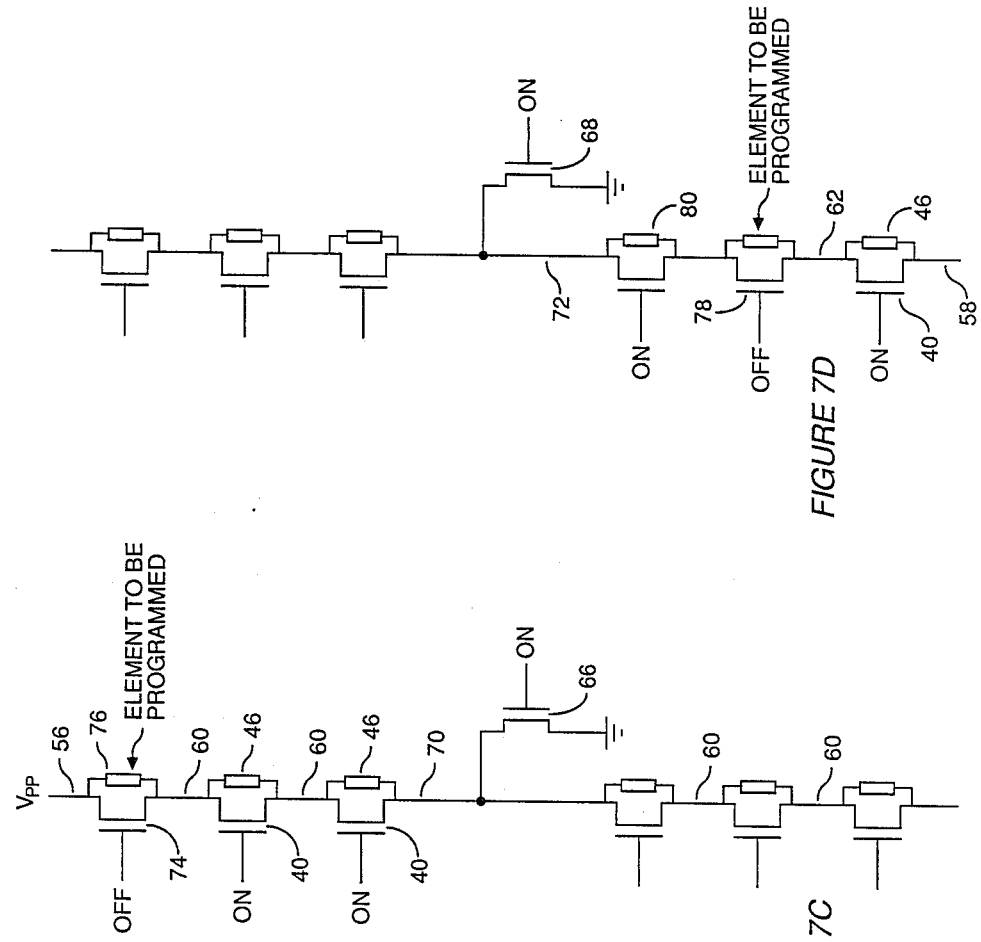
*FIGURE 7D*
*FIGURE 7C*

USER PROGRAMMABLE INTEGRATED CIRCUIT INTERCONNECT ARCHITECTURE AND TEST METHOD

BACKGROUND OF THE INVENTION

1. Field of the Invention

The present invention relates to integrated circuit (IC) technology. More specifically, the present invention pertains to user-configurable interconnections for array logic and other circuitry.

2. The Prior Art

An integrated circuit uses a network of metal interconnects between the individual semiconductor components which ar patterned with standard photolithographic processes during wafer fabrication. Multiple levels of metalized patterns may be used to increase the flexibility of the interconnects. For example, in very Large Scale Integration, higher density and more complex wiring networks are needed.

It has long been recognized that a user-programmable interconnect technique or manufacturer programmability just prior to shipment would allow lower tooling costs and faster delivery time. One technique to accomplish this uses lasers to make or break pre-patterned metal interconnects between an array of logic cells. This is usually performed on the finished wafer prior to assembly or actually in an open package. Another approach uses an array of uncommitted interconnect metal lines using anti-fuses consisting of an amorphous silicon alloy sandwiched into insulation holes between third and fourth metal layers to provide electrically programmable links.

Such systems of interconnect may be used in analog or digital integrated circuits fabricated using bipolar, MOS or other semiconductor technologies. The laser approach requires sophisticated programming equipment and is fairly slow, requiring many hours to pattern one device having a complexity of two to three thousand circuit elements. Various techniques for electrically programmable interconnects suffer from three major problems: the architectural approaches are not silicon efficient; the connectivity is inflexible; and the speed performance is degraded.

A gate array circuit is an array of uncommitted gates with uncommitted wiring channels. To implement a particular circuit function, the circuit is mapped into the array and the wiring channels and appropriate connections are mask programmed by the IC gate array vendor to implement the necessary wiring connections that form the circuit function. The gate array vendor then fabricates the circuit according to the constructed masks. Gate arrays are therefore mask programmable and not user programmable.

User-programmable logic arrays are widely used in digital system design in implementing many logic functions and replacing transistor-transistor logic (TTL) parts. Logic arrays currently available include PLA (Programmable Logic Arrays), FPLAs (Field Programmable Logic Arrays), EPLDs (Erasable Programable Logic Devices) and logic cell arrays using RAM (Random Access Memory) cells to define logic cell function and interconnect configuration. Programmable logic circuit arrays have been usually implemented in bipolar technology using fusible links which, when programmed, define the logic function to be implemented. An example of such a link is the polysilicon fuse which is "programmed" when it is blown and prevents current flow in a circuit. Such fusible links often require large current to operate and require extra area on the IC. More recently, electrically programmable read-only memory (EPROM) and electrically erasable read-only memory (EEROM) technology has been used to construct programmable logic circuit arrays. In the latter case, EPROM or EEROM cells are programmed and the stored values used to define circuit configuration.

Existing programmable array logic circuits use an AND plane of gates followed by an OR plane of gates to implement a particular logic function. The AND plane is usually user programmable while the OR plane programming is usually fixed. Variations to this architecture include registered outputs of the OR plane, partitioning of the array into smaller AND - OR arrays or macrocells and programmable input/output (I/O) architecture to implement several options of I/O requirements. The RAM-implemented logic cell array consists of a matrix of configurable blocks which are programmed to implement a particular logic function by loading an internal RAM with the appropriate data pattern. The array has a network of user-programmable MOS transistors acting as electrical switches as well as vertical and horizontal lines or wires to connect the logic blocks together and to the I/O blocks.

Existing user-programmable array logic circuits described above are useful in implementing certain logic functions but have several disadvantages. First, the use of an AND plane/OR plane combination of gates to implement logic functions is inflexible and is not well suited to the requirements of random logic functions. Second, the utilization factor of such an array is quite low and a large number of gates are wasted. Third, the IC chip area-per-functional capability is usually quite high.

Gate arrays, on the other hand, are more flexible than programmable array logic and much more efficient in their gate utilization and IC chip area utilization. However, their main disadvantage is that they are mask programmable and not user programmable. This results in much higher costs to develop the circuit and its unique mask patterns, and a long turn-around time to order and receive IC chips.

The RAM-implemented logic cell array offers more flexibility than the above programmable circuits due to the nature of the array, its logic blocks, and the interconnect capability. However, it has several disadvantages. First, the interconnect method uses MOS transistors that are costly in area slow down the performance and are volatile as they will deprogram when power is disconnected. Additionally, the use of RAM cells to define the logic block function, its architecture and interconnect scheme is very inefficient in area utilization and must be loaded from other non-volatile memory devices.

OBJECTS OF THE INVENTION

An object of the invention is to provide a user programmable circuit with a flexible interconnect architecture that allows the implementation of field programmable semi-custom ICs with high complexity and performance.

An additional object of the invention is to provide an array logic circuit which is more flexible than existing programmable logic circuits, more efficient in IC area utilization, more efficient in gate utilization, and allows 100% observability of any internal logic node from the external pad interface.

It is also an object of the invention to provide a user programmable array logic circuit that provides the same capabilities and versatility as mask programmed gate arrays with comparable performance characteristics. Other objects and features of the invention will become apparent to those skilled in the art in light of the following description and drawings of the preferred embodiment.

BRIEF DESCRIPTION OF THE INVENTION

In accordance with the present invention, a user programmable interconnect architecture is disclosed. Many kinds of electrical components or elements, which will here be generally referred to as "modules," may be interconnected by this architecture. One logic implementation of the user programmable interconnected architecture is hereinafter referred to as Configurable Array Logic circuit (CAL). The CAL consists of a plurality of logic cells or logic modules placed in an array or matrix. The array has a set of vertical wiring channels and a set of horizontal wiring channels that are programmed by the user to interconnect the various logic cells to implement the required logic functions. Additional sensing circuitry and wiring is included to allow 100% observability of internal circuit nodes, such as logic cell outputs, from the external pad interface. This is accomplished by a user-moveable probe which provides access to any internal test point in the array.

Connections to the wiring channels are made by a normally-open programmable element situated at the intersection of any two wires to be connected. To make a connection, the programmable element is programmed, resulting in a permanent low-impedance electric connection between the two wires. To provide more efficient utilization of the wiring channels, a plurality of these programmable elements are used to segment the vertical and horizontal channels into shorter wire lengths. These segments may be joined together to form longer wire connections by programming the programmable elements or left as is to provide independent segment wire lengths and allow the same wiring channel position to be used several times for different circuit connections.

Programming circuitry is situated at the edge of the array. Programming and connectivity information is shifted into the programming circuit, and appropriate voltages applied to effect the desired connection patterns. The same vertical and horizontal channels that are used for wiring channels in normal operations may be used for programming the various interconnections and to provide complete testing of the array modules and wiring paths.

The logic cell used in the array is a universal element, and is very efficient in its implementation of random logic functions which are defined by the use of selected programmable elements.

Further, additional circuitry is included to allow 100% observability of any internal test point, such as logic cell or module outputs, thus providing a user-moveable probe inside the integrated circuit to test internal points from the external interface without having to actually physically probe the internal circuits.

Those skilled in the art will recognize the general applicability of the interconnect architecture disclosed herein to other types of circuits, both analog and digital.

BRIEF DESCRIPTION OF THE DRAWINGS

FIG. 1b is an example of a more detailed block diagram of the program, test and I/O circuitry of FIG. 1a.

FIG. 2c is a table showing the input and output connections to be used for the circuit of FIG. 2b to implement popular logic functions.

FIG. 3 is a schematic diagram of a programmable interconnect element shunted by its associated series pass transistor.

FIGS. 7a-7e further illustrate the channel wiring and segmentation techniques by showing several programming examples of different connection requirements.

DESCRIPTION OF PREFERRED EMBODIMENT

Figure 1A:
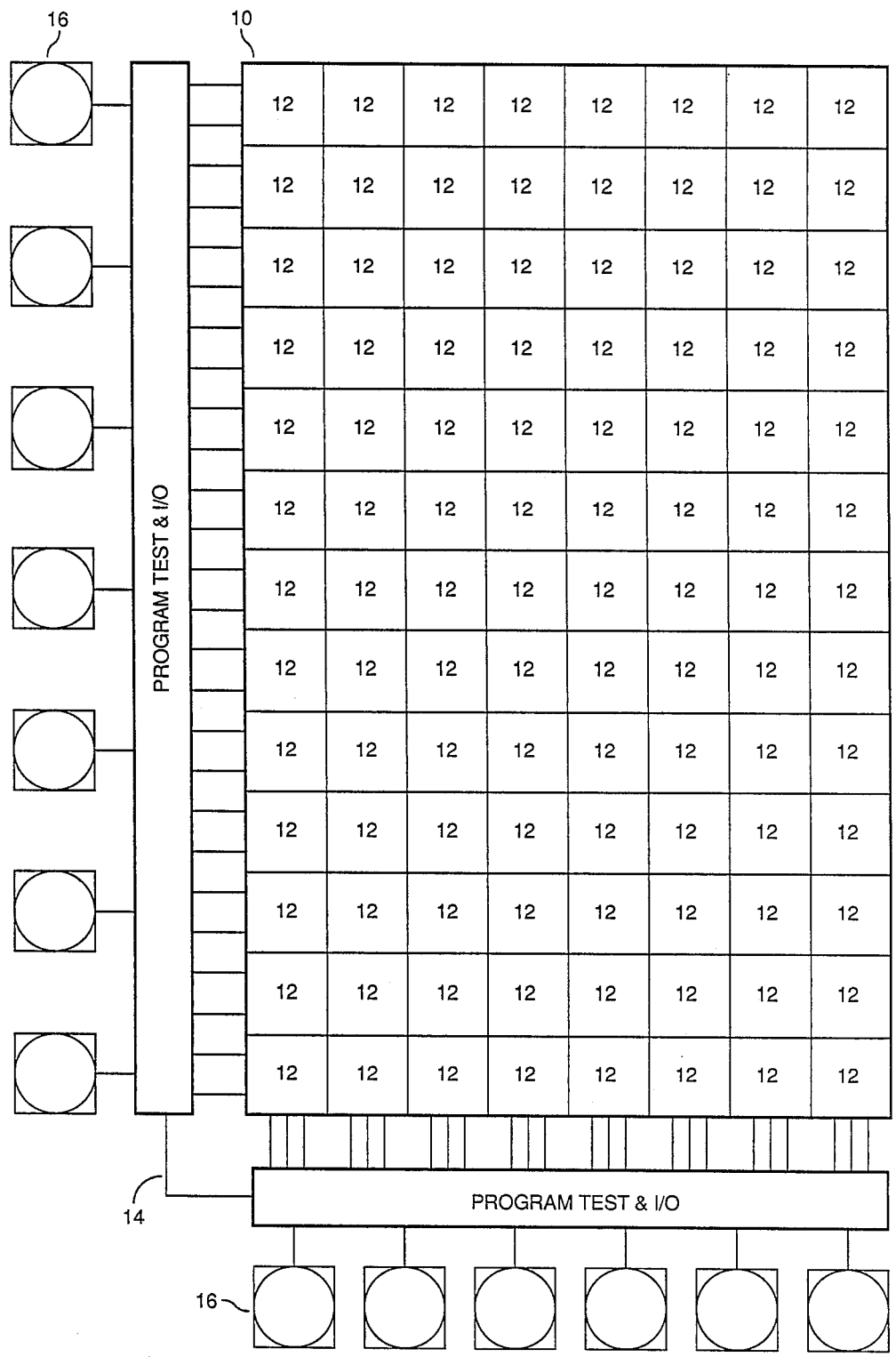
FIG. 1a is a block diagram of a preferred embodiment of a user-programmable gate array.

Referring first to FIG. 1a, a block diagram of one embodiment of the user programmable array circuit, one may see that the circuit contains an array block 10 organized into columns and rows of individual circuit modules 12; the program, test, and input/output (I/O) blocks 14 and the I/O pads 16. The number of columns or rows of modules 12 may be chosen to accommodate the desired array size. The program, test, and I/O blocks 14 are used to program all the required vertical and horizontal connections in the array, test the array logic and wiring channels, provide connections between the I/O pads and the array circuitry, and provide a mechanism to select any internal node as a test point to be observed from the I/O pads 16.

Figure 1B:
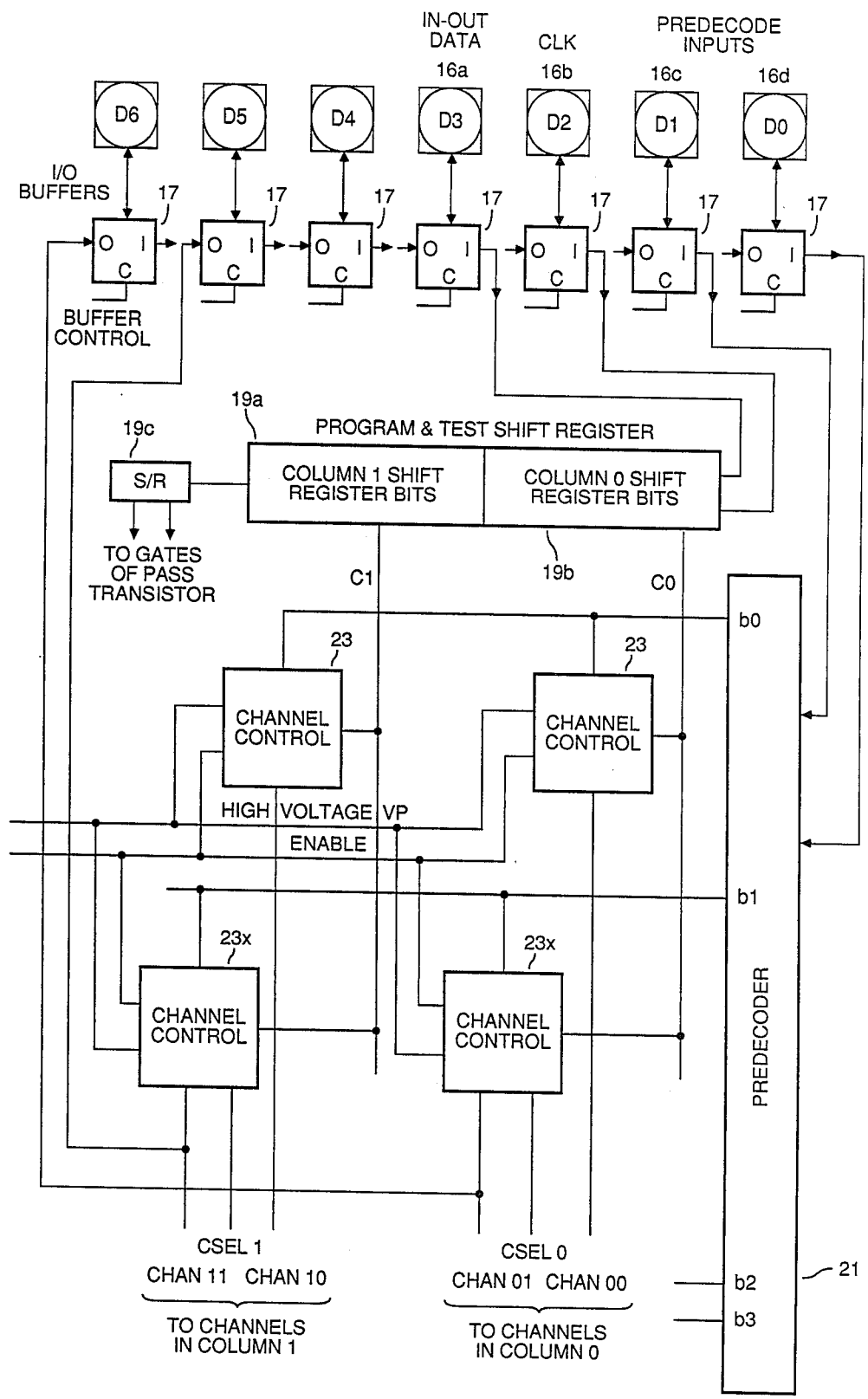

A preferred embodiment of the program, test and I/O logic 14 is shown in FIG. 1b. The figure illustrates how the circuit is used to program a plurality of channels using the example of channels situated in two different columns to explain circuit functionality. From the example illustrated in FIG. 1b, those of ordinary skill in the art will readily understand how any number of channels and columns can be programmed.

In order to select a particular channel for programming, a unique data pattern must be supplied to the circuit. The data pattern is supplied to the circuit via the I/O pads, illustrated in FIG. 1b at 16a, 16b, 16c, and 16d, respectively. The data pattern may be partitioned into two parts, a serial bit field and a parallel address selection field. Referring to FIG. 1b, the serial field is shifted into the circuit using I/O pad 16a. The clock signal needed to control the shifting of the data is supplied by I/O pad 16b. All I/O pads connect to I/O buffers 17, which may be bidirectional buffers as will be well understood by those skilled in the art.

Each Input/Output buffer 17 has the following connections: a connection to the pad, an input port I and an output port O and a buffer control input C to configure the Input/Output buffer as input, output or tri-state. Buffer control signals are appropriately generated from logic module outputs and internal control circuitry, which is needed during the different operating modes of the chip such as program mode, test mode, and normal mode.

Shifting of the serial input data is accomplished by shift registers 19. Shift control of the serial sequences may be performed by either on-chip or external circuitry. In the example illustrated in FIG. 1b, two stages of the shift registers 19a and 19b are shown, one shift stage per column. After loading, each shift stage contains the necessary data to control any channel within that column.

A parallel address field, also known as the predecoder (two bits wide in this example) is also supplied to the circuit by two I/O pads 16c and 16d. This field is then decoded by the 2:4 predecoder 21 having outputs $b_0$-$b_3$. Together the bits from shift registers 19a and 19b and the outputs of predecoder 21 uniquely specify the channel to be controlled for programming.

Programming control is implemented by the channel control logic units 23, which act as local decoders as well as voltage controllers for the channels. Each channel control logic unit 23, depending on the states of its inputs, is capable of driving its associated channel to Vpp (program voltage), GND, Vcc, or a tri-state or intermediate voltage to prevent programming. Those of ordinary skill in the art will readily recognize that channel control logic units 23 may be configured using standard transistor switching circuitry.

The predecoder 21 illustrated in FIG. 1b in this implementation is a 2:4 decoder. Outputs b2 and b3 are shown unconnected but they would normally connect to other channel control logic units (not shown) to control more channels. The predecoder size and number of bits per shift register stage are arbitrary and are selected so that their combination is capable of uniquely selecting a channel control block, and they result in an efficient use of silicon space.

During programming, the circuit illustrated in FIG. 1b operates as follows. Input data, representing channels to be programmed, is shifted into shift registers 19a and 19b by a shift clock input appearing at I/O pad 16b. Pre-decode inputs are presented to I/O pads 16c and 16d, and through I/O buffers 17 to pre-decoder 21. Assume that the inputs on I/O 16c and 16d have caused the b0 output of pre-decoder 21 to become active low. Assume further, that output Co from shift register 19b is true and that the output C1 from register 19a is false, indicating that channel 00 is to be programmed and channel 10 is not to be programmed. Combination of the active low b0 signal and the true Co signal on channel control unit 23b, in conjunction with the enable signal, indicating that programming is to take place, causes the programming voltage Vpp to appear on the channel 00 line. Channel control unit 23a, however, has a false signal on line C1 coming from shift register 19a so even in the presence of the active low b0 signal and the enable signal the programming voltage Vpp is not enabled onto the channel 10 line. Instead an intermediate voltage is applied to that channel so that no programming connection is made to that channel.

From the above description, it is seen readily by those of ordinary skill in the art how an array of virtually any size may be programmed, by using such programming circuitry at appropriately selected sections of the array.

Figure 2A:
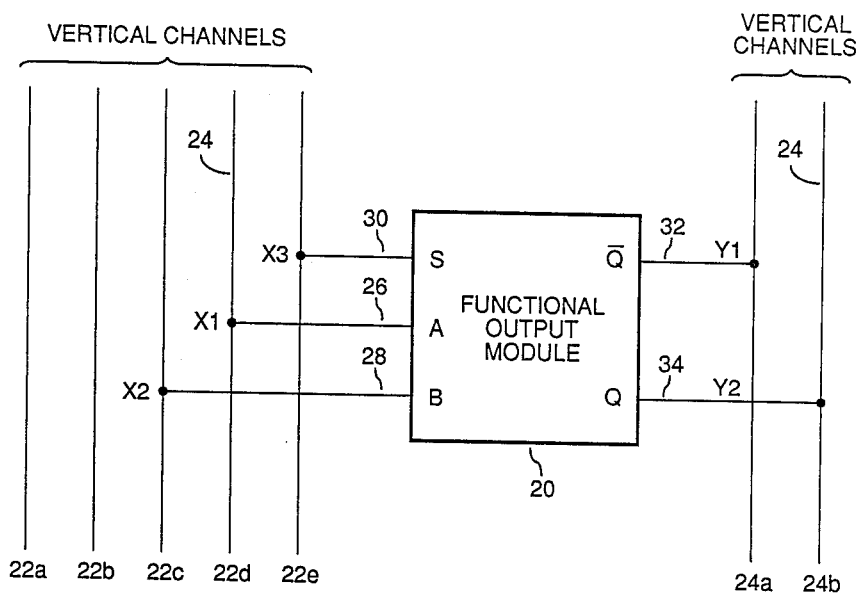
FIG. 2a is a block diagram of a preferred embodiment of a logic array module and its associated vertical and horizontal wiring channels.
Figure 2B:
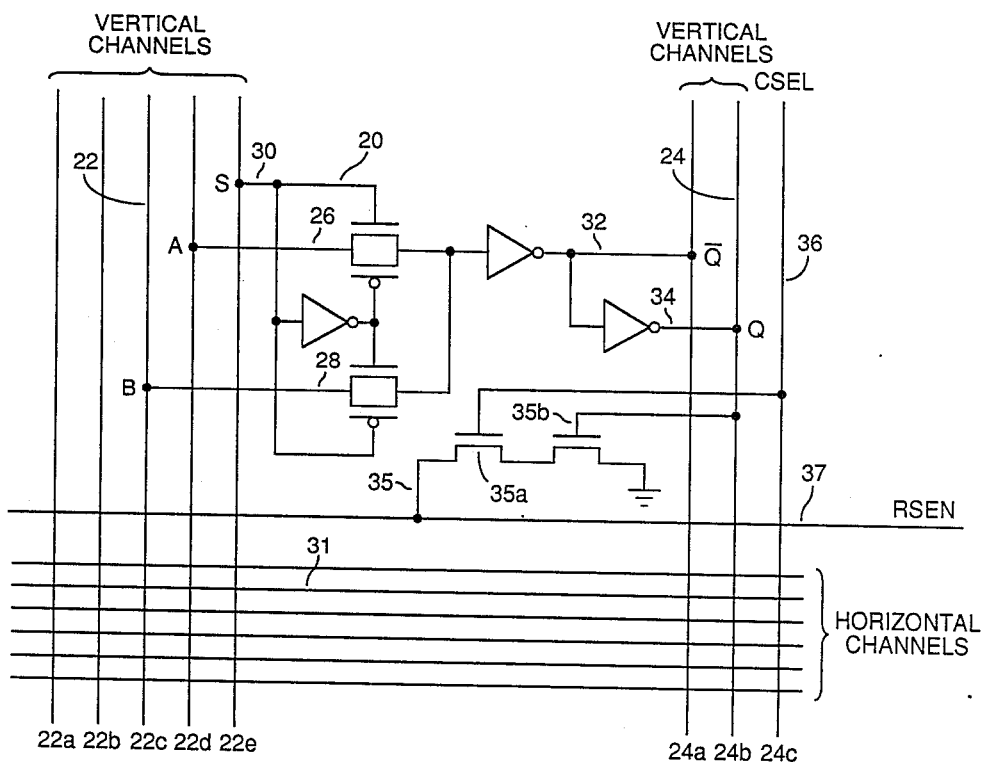
FIG. 2b is a logic diagram of the logic array module of FIG. 2a, showing connections to the horizontal and vertical wiring channels.

The individual circuit module 12 is shown in block diagram forms in FIGS. 2a and 2b. Referring first to FIG. 2a, each individual circuit module 12 comprises a functional circuit module, designated generally as 20 and vertical wiring channels generally designated 22 and 24. (The terms "vertical" and "horizontal" are terms chosen to conveniently describe the wiring channels as they appear in the drawings; no necessary relation to the actual directions is to be implied.) The vertical wiring channels 22 are wire segments joined by programmable elements, as will be described below. Functional circuit module 20 has its A input terminal 26, its B input terminal 28, and its S input terminal 30 connected to vertical channels 22d, 22c, and 22e, respectively, and its $\overline{Q}$ output terminal 32 and Q output terminal 34 connected to vertical channels 24a and 24b, respectively. X1, X2, and X3, refer to the inputs of input terminals A, B, and S; Y1 and Y2 refer to the outputs of output terminals $\overline{Q}$ and Q.

Those of ordinary skill in the art will recognize that a programmable array architecture configured according to the present invention may have different types of array modules as well as combinations of two or more types of modules. Further, portions of the array may be replaced by large circuit blocks or megacells such as random access memory (RAM), read only memory (ROM), multiplier, and arithmetic logical units (ALU) optimized to implement certain functions. In addition, such an array may have a varying number of vertical and horizontal wiring channels.

Referring now to FIG. 2b, functional circuit module 20 will be described. In a presently preferred embodiment, functional circuit module 20 is a universal logic module having 5 terminals: 3 input and 2 output. Input terminals A, B, and S are shown at 26, 28 and 30 respectively. Output terminals $\overline{Q}$ and Q are shown at 32 and 34 respectively.

The cell's function is a 2:1 multiplexor and provides both the true and complement value of the function. This logic cell is quite versatile and can be used to implement a large number of logic functions. The use and versatility of such a cell is disclosed in X. Chen and S. L. Hurst, "A Comparison of Universal Logic Module Realizations and Their Application In the Synthesis of Combinatorial and Sequential Logic Networks," IEEE Transactions on Computers, Vol. C-31, no. 2. pp. 140-147, February, 1982, which is expressly incorporated herein by reference. FIG. 2c is a table showing the connections of the various inputs and outputs necessary to achieve popular logic functions. The five terminals of the logic cell (S,A,B,$\overline{Q}$,Q) are hardwired to 5 separate vertical wiring channels as shown in FIGS. 2a and 2b.

Also shown in FIGS. 2b is a testability circuit, designated generally as 35. In a preferred embodiment, this circuit comprises two N channel transistors 35a and 35b. The gate of transistor 35a is connected to CSEL. The gate of transistor 35b is connected to the Q output of the module. The drain of 35a is connected to the RSEN line and its source is connected to the drain of transistor 35b. The source of transistor 35b is grounded. When column select line (CSEL) 36 is activated by program, test, and I/O blocks 14, transistor 35a is biased to conduct. Both CSEL line 36 and RSEN line 37 are continuous lines; one CSEL line 36 will be provided for each column of functional circuit modules 20 and one RSEN line 37 will be provided for each row of functional circuit modules 20. Thus a moveable probe, able to connect to the output of any selected logic module, is provided.

The embodiment depicted in FIG. 2b of an array module 12 according to the present invention consists therefore of a functional circuit module 20 with inputs S, A, B and outputs $\bar{Q}$ and Q, a testability circuit 35, vertical wiring channels, and horizontal wiring channels. The horizontal wiring channels 31 are wire segments joined by programmable elements, as will be described below. While the embodiments disclosed herein refer to channels as horizontal and vertical, those of ordinary skill in the art will readily recognize that any shape of path may be employed as a matter of design choice.

FIG. 3 depicts a preferred embodiment of the connection 38 which connects together the segmented wiring channels of the present invention. A series pass transistor 40 has its source 42 and drain 44 connected by a programmable element 46. In a preferred embodiment, programmable element 46 consists of an element like that described in a co-pending application entitled "Programmable Logic Interconnect Circuit Element," Ser. No. 861,519, filed May 9, 1986, and assigned to the same assignee as the present invention. This application is expressly incorporated herein by reference. Simply stated, this "interconnect circuit element" consists of two conductors separated by a dielectric.

Those of ordinary skill in the art will recognize that in certain applications a diode interconnect element, like that described in co-pending application, Ser. No. 864,038, filed May 16, 1986, entitled "Programmable Low Impedance Interconnect Diode Element" may be used. This co-pending application is hereby expressly incorporated by reference.

The series pass transistor 40 in parallel with the interconnect circuit element 46 is activated in order to bypass programmable element 46. When series pass transistor 40 is not activated, a potential may be created across programmable element 46 in order to "program" that element by creating a durable low-impedance electric contact between the two conductors, as described above. It will be understood by those of ordinary skill in the art that other programmable interconnect elements, such as fusible links, could be used to configure the architecture of the present invention, although the implementation mechanism would differ according to the nature of the interconnect element.

Figure 4:
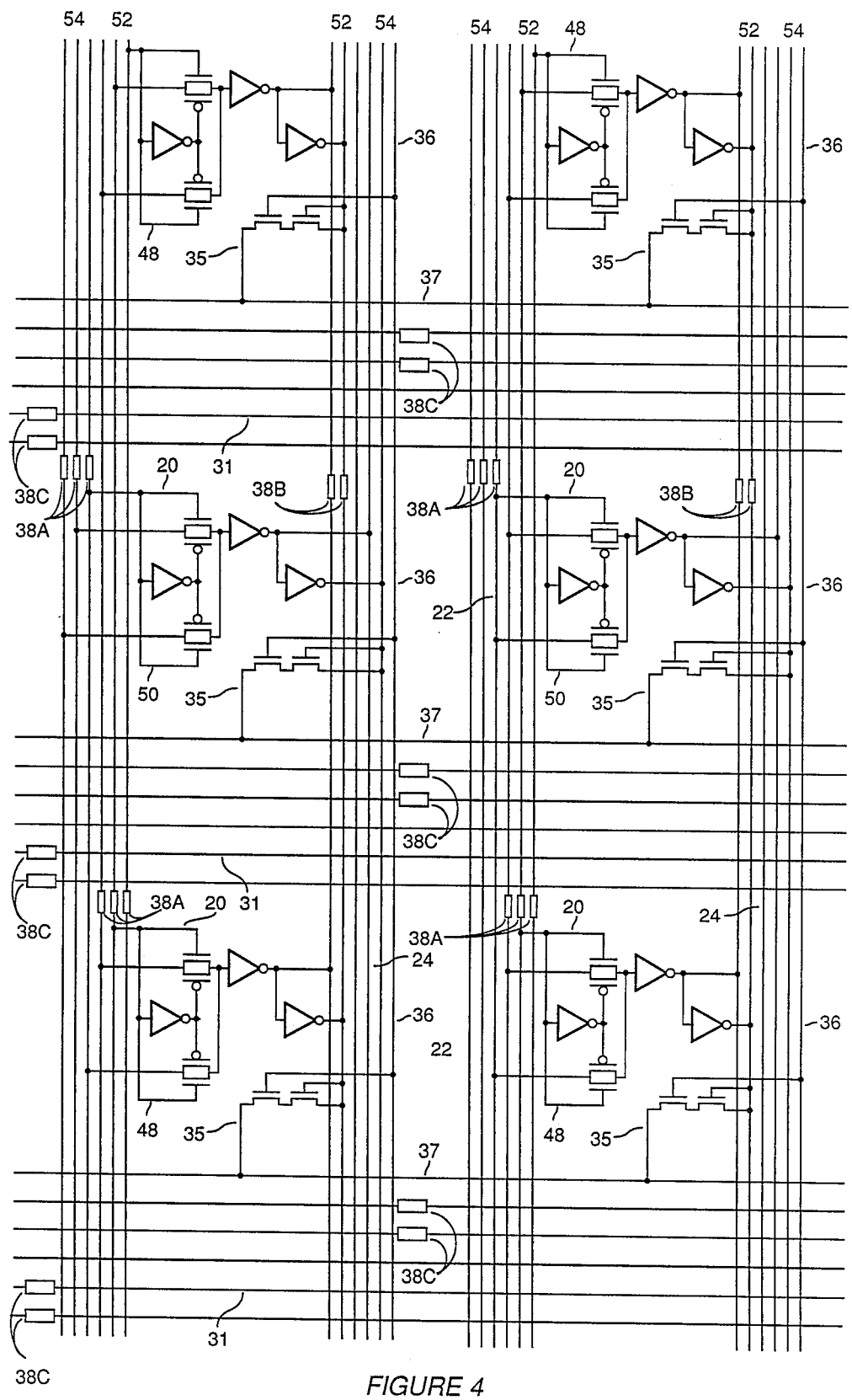
FIG. 4 shows an expanded view of a section of the CAL array consisting of two columns and three rows of modules.

FIG. 4 shows an expanded view of a section of the user-programmable circuit array with logic cells or individual circuit modules 12 in 2 columns and 3 rows. Each module is identical to the one shown in FIG. 2b. The diagram further illustrates how vertical wiring channels 22 and 24 and horizontal wiring channels 31 are connected to various logic cells and their allocation between adjacent cells. The vertical channels connected to the logic cell terminals are shared between the logic cells of alternate rows. This is done by segmenting the channels so that each cell has unique vertical channel segments. Cells in odd rows (cells 48) use the same vertical channel space (channels 52). Cells in even rows (cells 50) use the same vertical channel space (channels 54), but not the same vertical channel space as the odd rows (channels 52). Channel segmentation is accomplished by series pass transistors or pass series transistors with programmable elements connected in parallel connections 38A, 38B, and 38C generally described above under reference numeral 38. A similar channel segmentation technique is used for the horizontal wiring channels. In FIG. 4, connections 38A join vertical channel segments on the input side of the logic modules, connections 38B join vertical channel segments on the output side of the logic modules, and connections 38C join horizontal channel segments. The segmentation techniques are illustrated in more detail in FIGS. 5 and 6.

Figure 5:
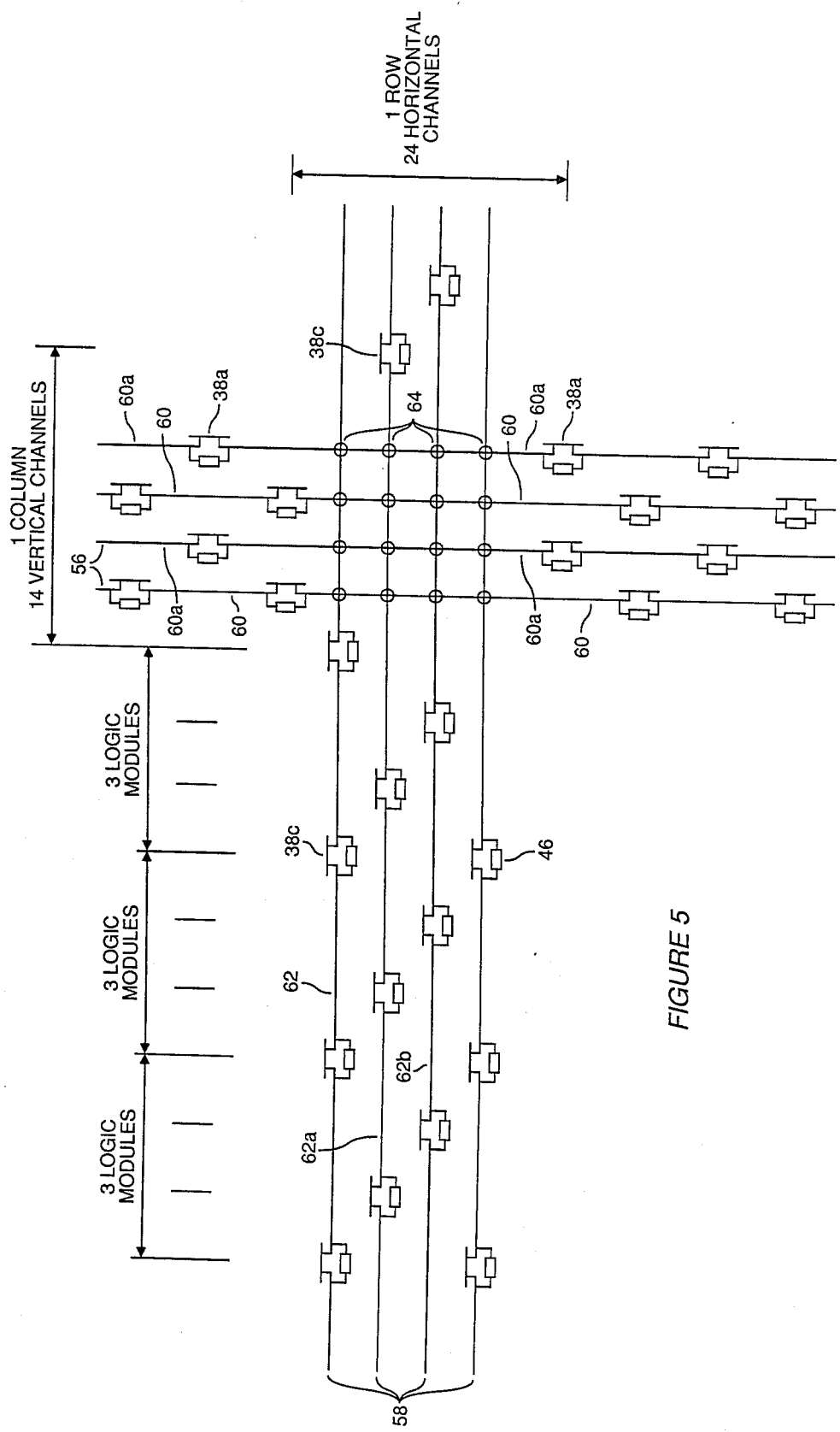
FIG. 5 is a schematic diagram of a portion of the vertical and horizontal channel wiring used in the CAL array.

FIG. 5 illustrates the vertical and horizontal channel wiring segmentation. As mentioned earlier, wiring channels are segmented and offset for a more efficient utilization of the available wiring space and reduction of overhead circuits for the selection and programming functions (the circuits that activate series pas transistors 40 in the connections 38). The example in FIG. 5 uses 14 vertical channels per column of modules and 24 horizontal channels per row of modules for a 23 column, 14 row matrix of logic modules; the vertical channels and horizontal channels shown are only illustrative; only vertical channels, horizontal channels, and control lines are shown in FIG. 6.

Figure 6:
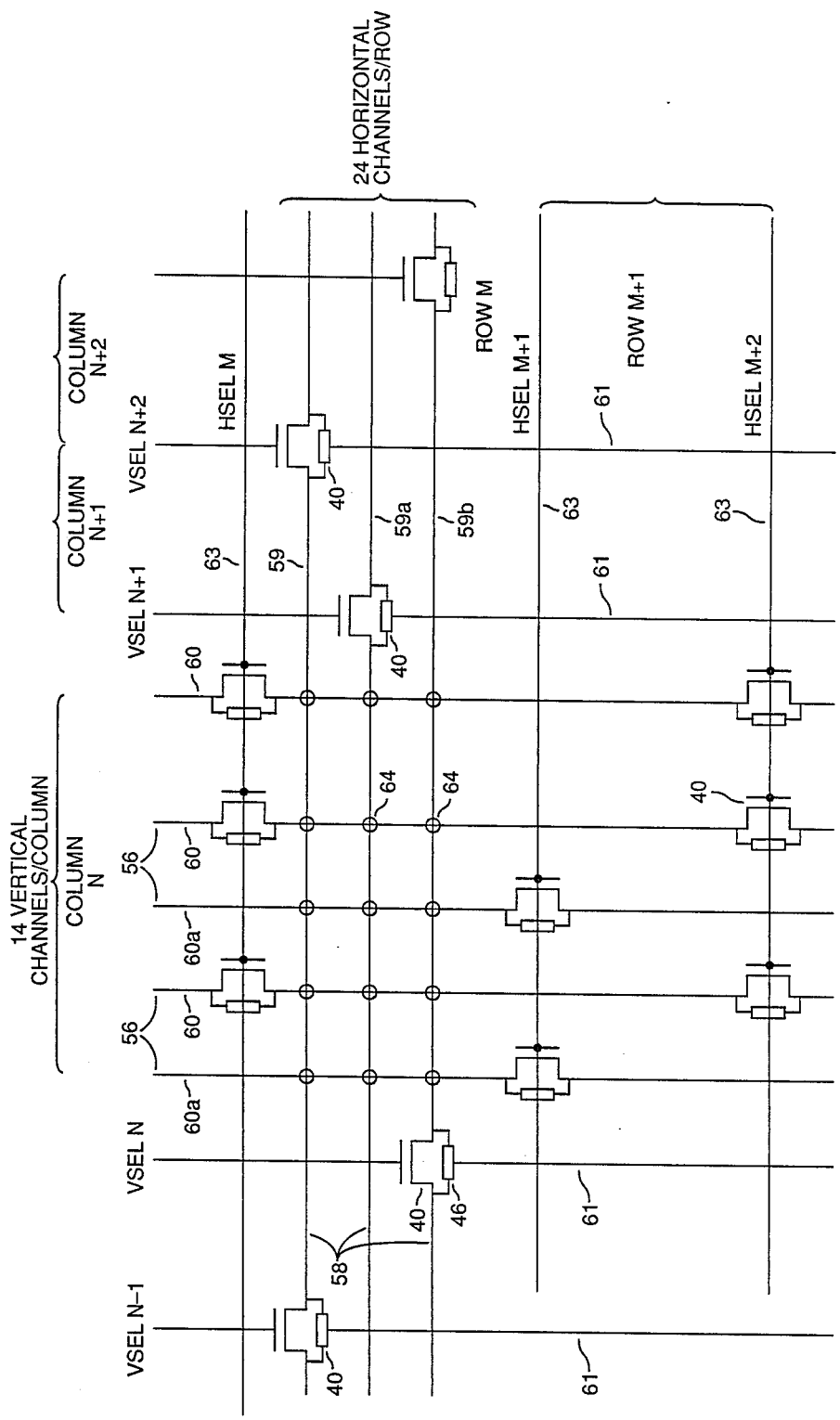
FIG. 6 is a further expansion of the horizontal and vertical channel wiring scheme to illustrate the segmentation mechanism.

Vertical channels generally referred to in FIGS. 5 and 6 as 56 are segmented into a series of segments 60 or 60a with each segment extending over the length of two rows and each segment separated from adjacent segments by series pass transistors 40 with a programmable element 46 connected in parallel.

Each vertical channel 56 is also offset by one module length from its adjacent channel. For example, as shown in FIG. 6, if a vertical channel segment 60 starts at module row M, then the adjacent channel segment 60a would start at module row M+1 and the following segment would start at module row M. The vertical offset technique is referred to as to a 2-way staggered wiring scheme. This segment offset technique provides a significant reduction in the number of channels required for routing.

The series pass transistors 40 that connect vertical wiring segments 60, 60a or horizontal wiring segments 59, 59a, 59b are controlled by vertical select lines (VSEL) 61 and horizontal select lines (HSEL) 63, respectively. The VSEL and HSEL control lines can bias the series pass transistors to which they are connected in order to cause such transistors to conduct. The control lines do not need to be continuous throughout the array as indicated in FIG. 6.

The series pass transistors 40 are used as feed-through selection transistors during programming of the programmable elements 46 as illustrated in FIG. 6. The vertical segment length must be at least one module length. A length of 2 is preferred but may be varied to implement different wiring alternatives. A long segment length is inefficient in the use of wiring space while a short segment length degrades performance and is less efficient in silicon area utilization. A similar segmentation and offset technique is applied to horizontal wiring channels 58. In the example shown in FIG. 5, the horizontal segment length is 3, i.e., each horizontal segment 62, 62a or 62b extends over 3 columns of modules. The horizontal wiring scheme also uses a segment offset technique with an offset value in a preferred embodiment of 30 module lengths.

Figure 7A:
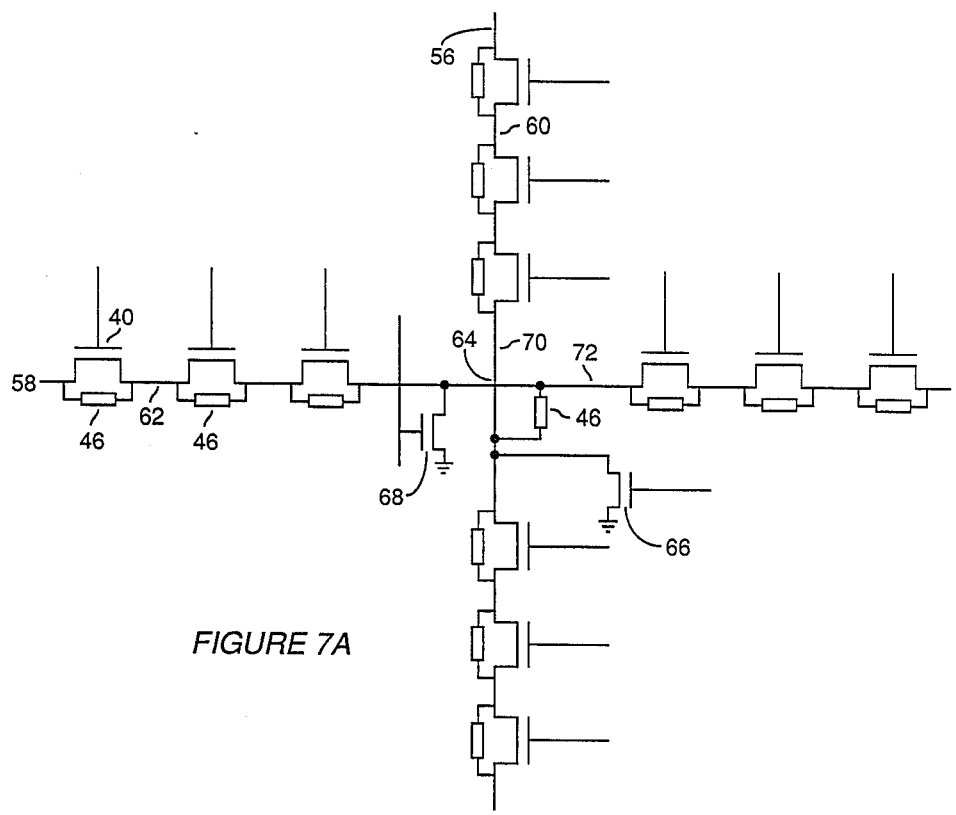

At the intersection 64 of each vertical and horizontal channel, a normally open or unfused programmable element 46 is placed, as may best be seen in FIG. 7a. When the programmable element 46 is programmed, an electrical connection is made between the channels at the intersection 64. In this architecture, any vertical channel may thus be connected to any horizontal channel by means of a programmable element.

FIGS. 7a to 7d illustrate the programming techniques used to connect various channel segment configurations including vertical to horizontal connection, vertical segment to vertical segment and horizontal segment to horizontal segment connection. FIG. 7a shows one vertical channel 56 and one horizontal channel 58 intersecting as shown. The relative locations of the vertical and horizontal channels in the array are not important and the same programming technique is used regardless of position in the array.

Two additional transistors are shown in FIG. 7a: a vertical select transistor 66 and a horizontal select transistor 68. The vertical select transistor 66 pulls the middle vertical segment 70 of a vertical channel 56 to ground while the horizontal select transistor 68 is used to pull middle horizontal segment 72 of a horizontal channel 58 to ground. Vertical or horizontal select transistors 66 or 68 may also charge up the middle segment to the appropriate voltage needed for programming. Vertical and horizontal select transistors 66 and 68 are useful to lower the series resistance of a witing channel during programming by reducing the number of transistors between the programming voltage and ground, as is best seen in FIGS. 7c and 7d. They need not be connected to middle wiring segments but middle wiring segments are preferred.

Figure 7B:
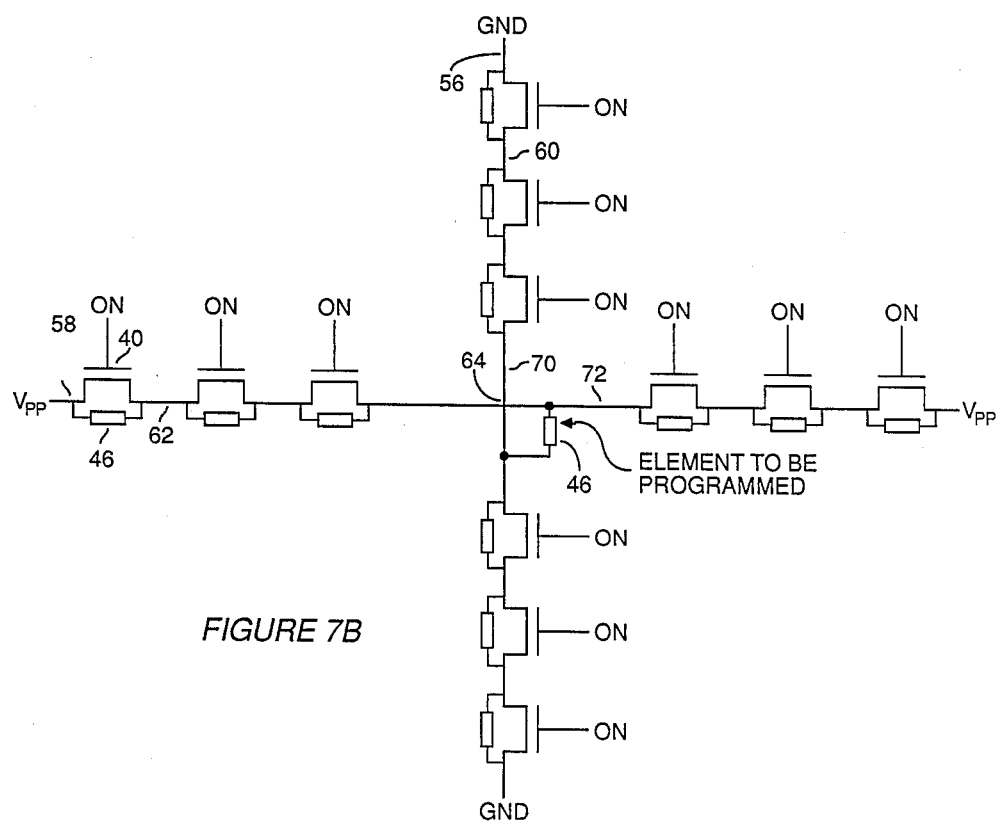

FIG. 7b illustrates how the vertical and horizontal channels may be programmed to make a connection between them. The programming voltage Vpp is applied to both ends of the horizontal channel 58 while ground potential GND is applied to both ends of the vertical channel 56. All series pass transistors 40 are turned ON, i.e., biased to conduct. The programmable element 46 at intersection 64 would then be programmed and a connection made between the two intersecting segments shown in FIG. 7b. The voltages Vpp and GND are applied to both sides of the horizontal and vertical channel to provide lower resistance in the programming path and hence more efficient programming and lower final resistance of the programming element 46 at intersection 64. All other horizontal and vertical segments not selected to program the programmable elements in FIG. 7b are biased to an intermediate voltage VI such that the voltage difference between VI and GND, and VI and Vpp is insufficient to program a programmable element. This same technique is used in all the programming examples shown in FIG. 7b-7d.

FIG. 7c illustrates how a vertical segment would be programmed to connect to its adjacent segment. The program voltage Vpp is applied to the programmable element 76 to be programmed while the middle segment 70 is pulled to ground by the vertical select transistor 66. All series transistors between Vpp node and the middle segment are turned ON except for the particular transistor 74 whose terminals are to be connected by the programmable element 76. This forces the programming voltage across the programmable element 76 and programs it.

FIG. 7d shows a similar scheme used for horizontal segment connections to adjacent horizontal segments. In this case, the horizontal select transistor 68 is turned on, pulling the middle horizontal segment to ground while Vpp is applied to one end of the horizontal channel. All series transistors are ON except the series transistor 78 whose terminals are to be connected by programming programmable element 80.

Those of ordinary skill in the art will recognize that the programming process is not reversible, and that, depending on how a particular array according to the present invention is implemented, thought should be given to the order in which the particular desired elements are programmed.

By way of illustration, attention is drawn to FIG. 7e, which shows wiring channels 82, 84, 86, and 88 having fuses 90, 92, 94, and 96 at their intersections. Pass transistor 98 is also shown. Assume that it is desired to program fuses 90, 92, and 94 but not 96.

Those of ordinary skill in the art will readily see that if fuses 90 and 92 are programmed before fuse 98, it cannot be guaranteed that fuse 94 can be programmed. This is because series pass transistor 98 must be turned on to allow fuse 94 to be programmed. If, however, fuses 90 and 94 are programmed prior to fuse 92, all three fuses may be programmed successfully, leaving fuse 96 unprogrammed, as desired.

Figure 8A:
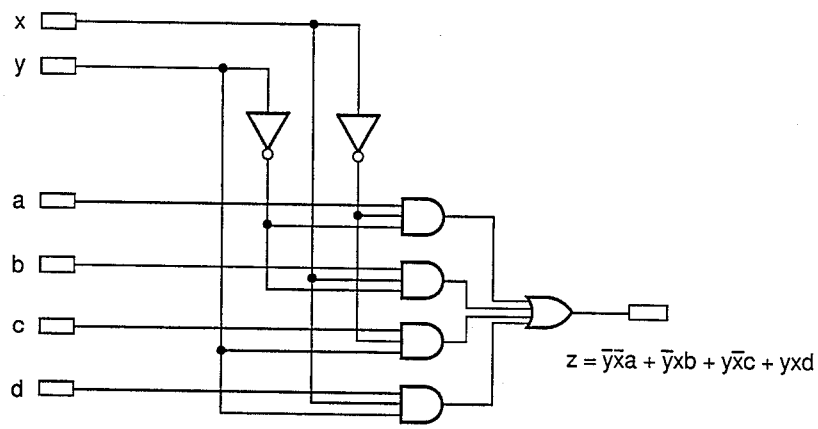
FIGS. 8a, 8b, 9a, and 9b are examples of use of the CAL logic cell, which illustrate how typical circuit connections would be made.
Figure 8B:
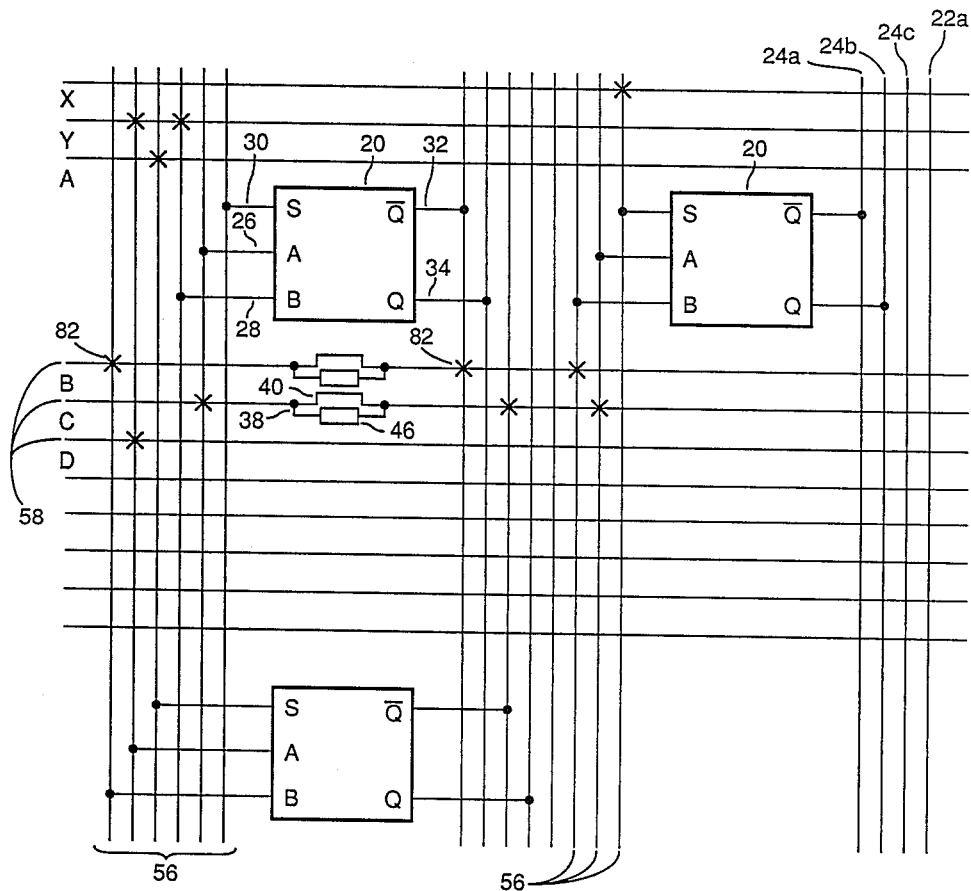

FIGS. 8a and 8b show a typical application of the logic array. (Testability circuit 35 is not shown.) FIG. 8a shows the logical function implementation of a one of four selector:

$$Z = \overline{Y}\,\overline{x}\,a + \overline{y}\,x\,b + y\,\overline{x}\,c + y\,x\,d$$

Where x, y, a, b, c, d, and z represent voltage inputs and outputs.

FIG. 8b (compare to FIG. 2a) shows how that logical function is mapped into the array using three logic cells 20 and associated vertical and horizontal channels 56 and 58. The X designation 82 at various vertical and horizontal channel intersections shows the location of a programmed element, i.e., the two intersecting wires have been connected by a programmable element using the techniques described in FIG. 7a.

Figure 9A:
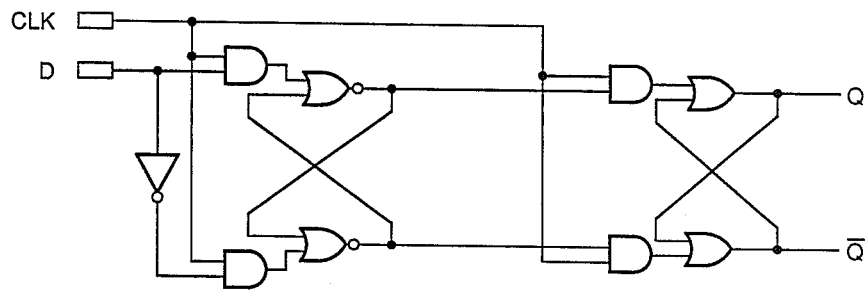
Figure 9B:
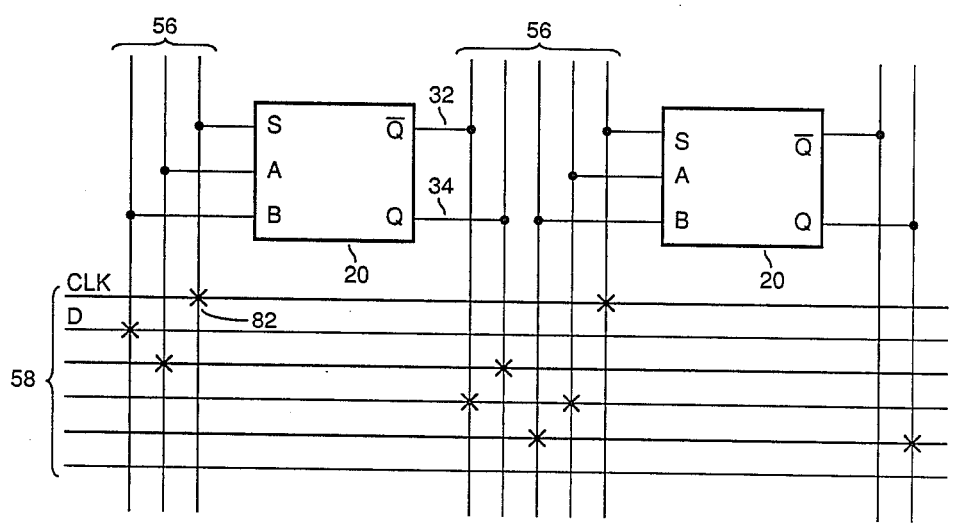

FIGS. 9a and 9b are another example of application of the logic array. FIG. 9a is the logic diagram of a masterslave flip flop, while FIG. 9b is the same masterslave flip flop implemented using two logic cells 20 of the logic array.

One embodiment of the program and test logic 14 uses a combination of shift registers and decoders to do the selection and control functions needed during programming or testing as disclosed with respect to FIG. 1b. To program a particular wiring connection in the interconnect grid, the appropriate data pattern is first shifted into shift registers in the program, test, and I/O blocks 14. Using this pattern and some local decode logic, the two horizontal and vertical wires to be connected in the grid are uniquely selected. A biasing voltage is applied to the appropriate VSEL lines 61 and HSEL lines 63 to turn ON the appropriate series pass transistors 46. The appropriate programming voltage is then applied and the connection made, using the techniques described in connection with FIGS. 7a-7d. All the selection and decoding is therefore done at the periphery of the array 10.

The same shift registers and decoders which are used for programming are also used for circuit diagnosis.

The test point selection data pattern is shifted into the shift registers 19 of the program, test and I/O circuit 14 in FIG. 1b and the output of a selected module is routed to the selected I/O pad 16 as shown in FIG. 10.a Test point selection of internal array module outputs is performed by shifting a unique selection pattern into the program and test shift registers 19. This provides column and row information for selecting the modules to be tested. To test the module outputs shown in FIG. 2b, the corresponding column select (CSEL) line 36 is activated by the program and test logic, thus gating a logic level representing the value of the logic output of the module through transistors 35a and 35b onto the row sense (RSEN) line 37. The row select data, like the column select information, is obtained from a bit field in the shift registers 19 in the program, test and I/O circuitry 14. A sense circuit 100 detects the module output signal and feeds row multiplexer 102, which using the row select data, routes the signal to a designated I/O pad 16 for external observability of that module's output. This testing method allows the selection of any module output as a test point for external user monitoring and provides a real time moveable probe to monitor internal chip node behavior. This probe method requires little additional circuit overhead, since programming and test circuitry are shared. This method may be expanded to provide multiple simultaneous probe test points.

Another diagnostic technique called the capture mode is also possible. FIG. 10b illustrates the use of the capture mode in logic function testing. In this mode, an externally supplied trigger signal placed on a designated I/O pad 102 is used to latch all input signals to the I/O pads 16 and I/O buffers 17 into input latches 104. The inputs then propogate through the configured logic and reach a frozen state since all input stimuli are captured and frozen by the input latches. The program, test and I/O logic is then used to move the probe around the circuit and select any test point for observance, as disclosed in the real time moveable probe method. Namely, a unique column n is selected by the CSEL and a row is selected by the row multiplexor and routed to a designated I/O pad. This capture mode is similar to the commonly used logic analyzer function for debugging and testing of the internal nodes of the array.

The moveable probe mode and the capture mode of circuit diagnosis described above can be used to diagnose and test the logic function after the programmable elements have been programmed. They can also be used to test the logic modules at the factory before the programmable elements are programmed to verify the integrity of these logic modules. In this case, the inputs to the logic modules are driven by the required test input patterns that are applied to selected I/O pads and connected to the logic module through the appropriate series pass transistors. The proper series transistors are selected by the data pattern shifted in the shift registers in the program and test and I/O circuits 14 in FIG. 1a.

Thus, preferred embodiments of the invention have been illustrated and described with reference to the accompanying drawings. Those of skill in the art will understand that these preferred embodiments are given by way of example only. Various changes and modifications may be made without departing from the scope and spirit of the invention, which is intended to be defined by the appended claims.

What is claimed is:

1. In an integrated circuit, an electrically programmable interconnect architecture, comprising:
    a plurality of modules placed in an array, the modules having connection nodes,
    a plurality of sets of wiring channels, at least some of said sets of wiring channels having at least one wiring channel comprising at least two wiring segments and wherein at least one of said wiring segments is connected to at least one of said connection nodes,
    a plurality of two-terminal, normally-open, electrically-programmable elements, each of said elements located between selected ones of said wiring segments comprising one of said channels, said programmable elements being characterized by a high impedance before programming and being selectively programmable by the user in order to create a permanent bidirectional low impedance electrical connection between wire segments.

2. The electrically programmable interconnect architecture of claim 1 wherein at least one of said wiring channels lies in a direction substantially non-parallel to the remainder of said wiring channels and is disposed in a layer electrically isolated from the layer containing said remainder of wiring channels, forming intersections.

3. The electrically-programmable interconnect architecture of claim 2, further comprising:
    programmable elements joining selected ones of those wiring segments of said sets of wiring channels which intersect each other at said intersections.

4. The electrically-programmable interconnect architecture according to claims 1, 2 or 3 further comprising:
    series-pass transistors, having control elements, connecting selected adjacent and intersecting ones of said segments, and
    selection circuitry connected to the control element of each of said series-pass transistors capable of selectively biasing each one of said series-pass transistors to cause it to conduct or not to conduct.

5. A user-programmable array logic circuit, comprising:
    a plurality of logic modules placed on a substrate, the logic modules each having connection nodes,
    a plurality of first wiring channels running in a first direction, at least one of which is connected to at least one of said connection nodes,
    a plurality of second wiring channels running in a second direction and disposed in a layer electrically isolated from the layer containing said first wiring channels, intersecting said first wiring channels at intersections,
    a two-terminal, electrically-programmable, normally-open element joining at least one of the intersection wiring channels,
    said element being selectively programmable by the user in order to create a permanent bidirectional low-impedance electrical connection between intersecting wiring channels.

6. The array logic circuit according to claim 5, in which one or more of said wiring channels comprises a series of wiring segments and further including said elements coupled between adjacent one of said wiring segments.

7. The logic circuit according to claim 5 in which substantially all of said first and second wiring channels comprise a series of wiring segments having a length of at least ther smaller of the length or width of one logic module.

8. The array logic circuit according to claim 6 in which wiring segments of said first wiring channels have a length equvalent to the length of two logic modules and the wiring segments of said second wiring channels have a length equivalent to the width of three logic modules.

9. The logic circuit according to claim 6 in which series-pass transistors are placed in parallel with selected ones of said elements.

10. The logic circuit according to claim 6, in which at least two of adjacent ones of said wiring segments forming a wiring channel are joined in series at their ends by said elements.

11. The array logic circuit according to claim 9, in which at least two of adjacent ones of said wiring segments forming a wiring channel are joined in series at their ends by series pass transistors having control elements.

12. The logic circuit according to claim 11 further comprising selection circuitry connected to the control element of each series-pass transistor in order to cause said series-pass transistor to conduct or not to conduct current between the wiring segments to which it is electrically connected.

13. The logic circuit according to claim 11 further comprising select transistors electrically connected to a middle wiring segment of each wiring channel which, when biased to conduct, connects the middle wiring segment to a selected potential.

14. The logic circuit according to claim 12 or 13 further comprising:
   programming circuitry, electrically connectable to selected ones of said wiring segments by said selection circuitry for providing programming voltage to program selected ones of said programming elements.

15. A programmable array logic circuit, comprising:
   a plurality of logic modules placed in any array, said logic modules each having connection nodes,
   a plurality of sets of wiring channels, at least one of said wiring channels is connected to at least one of said connection nodes, each set of wiring channels having at least one wiring channel comprising at least two wiring segments, at least one said wiring channels being in a direction substantially non-parallel to other ones of said wiring channels,
   the wiring segments of at least one of the wiring channels being joined in series by series-pass transistors,
   at least two of said wiring segments of each wiring channel being joined in series by a normally-open, electrically programmable element,
   at lest two of said wiring segments that intersect each other being connected by programmable elements,
   programming circuitry connected to said series-pass transistors capable of selectively biasing said series-pass transistors to cause them to conduct or not to conduct.

16. In a programmable array logic circuit comprising a plurality of logic modules placed in an array, said logic modules each having connection nodes, a plurality of sets of wiring channels, at least one of said wiring channels connected to at least one of said connection nodes, each set of wiring channels having at least one wiring channel comprising at least two wiring segments, the wiring segments of at least one of the wiring channels being joined in series by series-pass transistors, at least two of said wiring segments of each wiring channel being joined in series by a normally-open, electrically programmable element, at least two of said wiring segments that intersect each other being connected by programmable elements, programming circuitry connected to the control elements of said series-pass transistors capable of selectively biasing said series-pass transistors to cause them to conduct or not to conduct, a method of programming a selected programmable element, comprising the steps of:
   (a) preselecting a group of series-pass transistors to be biased to conduct such that a first complete current path will exist from a source of a first potential to one end of said selected programmable element and a second complete current path will exist from a source of a second potential to the other end of said selected programmable element when said preselected series-pass transistors are biased,
   (b) biasing said group of series-pass transistors to conduct, and
   (c) applying said first potential to the end of said first current path furthest from said programmable element and applying said second potential to the end of said second current path furthest from said programmable element, in order to program said selected programmable element not bypassed by a conducting series-pass transistor, thereby creating a permanent bi-directional low-impedance electrical connection between wiring segments at the location of said selected programmable element.

17. A method of programming preselected one of a plurality of programmable elements, each of said programmable elements being located between two adjacent wiring segments in series in a selected wiring channel, selected ones of said programmable elements being connected in parallel with a series-pass transistor, comprising the steps of:
   (a) biasing to conduct all series-pass transistors in a portion of the wiring channel that includes the adjacent selected wiring segments, with the exception of the transistor connected in parallel with said preselected programmable element,
   (b) applying a programming voltage between the ends of said selected wiring channel portion in order to cause a sufficiently high voltage to appear across the preselected programmable element to cause it to be programmed.

18. A method of programming a preselected programmable element at the intersection of two wire segments of two selected intersecting wiring channels, comprising the steps of:
   (a) biasing to conduct all series-pass transistors joining each wire segment in each said selected wiring channel,
   (b) applying a programming voltage between said intersecting wiring channels in order to cause a sufficiently high voltage to appear across the preselected programmable element to cause it to be programmed.

19. The method of claims 17 or 18, including the further step of applying an intermediate voltage on all other wiring segments in all wiring channels other than the said selected wiring channel such that the difference between said intermediate voltage and said programming voltage is insufficient to program all programmable elements other than the said preselected programmable element.

20. In an integrated circuit, an electrically programmable interconnect architecture, comprising:
- a plurality of modules placed in an array, the modules having connection nodes,
- a plurality of sets of wiring channels, each set of wiring channels having at least one wiring channel comprising at least two wiring segments and wherein at least one of said wiring segments is connected to one of said connection nodes,
- a plurality of normally-open, electrically-programmable elements, each of said elements located between selected ones of said wiring segments, said programmable elements being characterized by a high impedance before programming and being selectively programmable by the user in order to creat a bidirectional low-impedane electrical connection between wiring segments,
- series-pass transistors connected between selected ones of said wiring segments, each of said series-pass transistors having a control element,
- selection circuitry connected to said control elements of each of said series-pass transistors.

21. The electrically-programmable interconnect architecture of claim 20, further including
means for selectively applying a programming voltage to selected ones of said wiring segments.

22. In an integrated circuit, an electrically-programmable interconnect architecture, comprising:
- a plurality of function modules, having connection nodes,
- a plurality of wiring channels, selected ones of said wiring channels being arranged as at least two wiring segments, at lease one of said wiring segments being connected to one of said connection nodes,
- a plurality of electrically-programmable elements, connected between selected ones of said wiring segments,
- series-pass means, connected in parallel with selected ones of said electrically-programmable elements, for temporarily causing electrical connections between said wiring segments to which they are connected,
- selection means for providing signals to said series-pass means, to cause a said series-pass means to temporarily conduct.

* * * * *

UNITED STATES PATENT AND TRADEMARK OFFICE
CERTIFICATE OF CORRECTION

PATENT NO. : 4,758,745
DATED : July 19, 1988
INVENTOR(S) : Abbas A. El Gemal, et al.

It is certified that error appears in the above-indentified patent and that said Letters Patent is hereby corrected as shown below:

In the drawings, Fig. 1B should be deleted to appear as per attached page.

Signed and Sealed this

Twenty-eighth Day of November 1995

Attest:

BRUCE LEHMAN

*Attesting Officer*     *Commissioner of Patents and Trademarks*

UNITED STATES PATENT AND TRADEMARK OFFICE
CERTIFICATE OF CORRECTION

Page 2 of 8

PATENT NO. : 4,758,745
DATED : July 19, 1988
INVENTOR(S) : Abbas A. El Gamal, Khaled A. El-Ayat, Amr Mohsen It is certified that error appears in the above-indentified patent and that said Letters Patent is hereby corrected as shown below:

In the section entitled "Inventors", replace "Elgamal" with --El Gamal--.

Column 1, line 15, replace "ar" with --are--.

Column 4, line 33, replace "Would" with --would--.

Column 8, line 68, replace "30" with --3--.

Column 9, lines 48-49, replace "programming" with --programmable--.

Column 10, line 21, replace "98" with --94--.

Column 10, line 33, replace "$Z = \bar{Y}\bar{x}a + \bar{y}xb + y\bar{x}c + yxd$" with
--$Z = \bar{y}\bar{x}a + \bar{y}xb + y\bar{x}c + yxd$--.

Column 10, line 47, replace "masterslave" with --master-slave--.

Column 10, line 62, replace "46" with --40--.

Figure 10A:
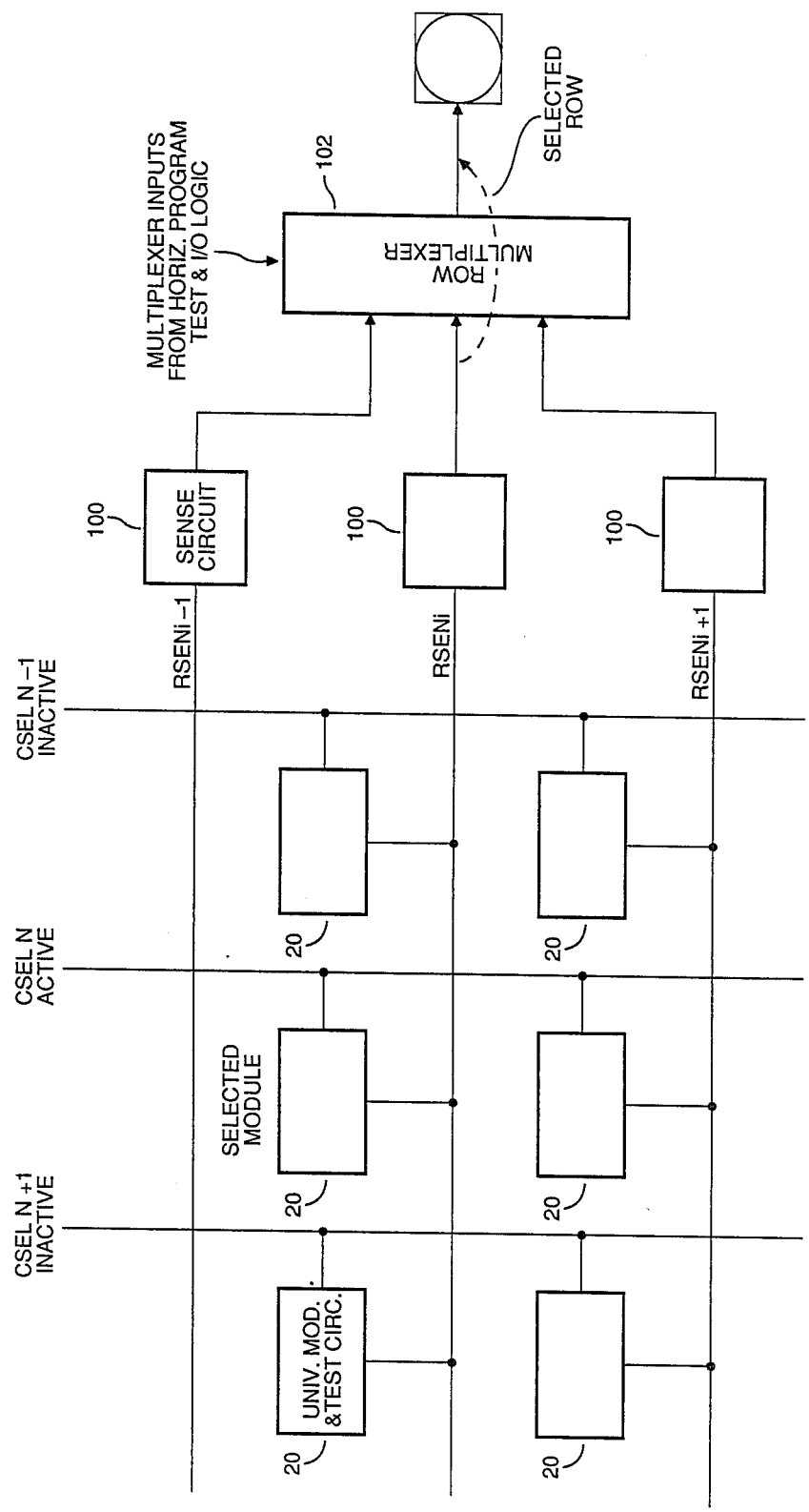
FIG. 10a illustrates the operation of the moveable probe mode of diagnosis.
Figure 10B:
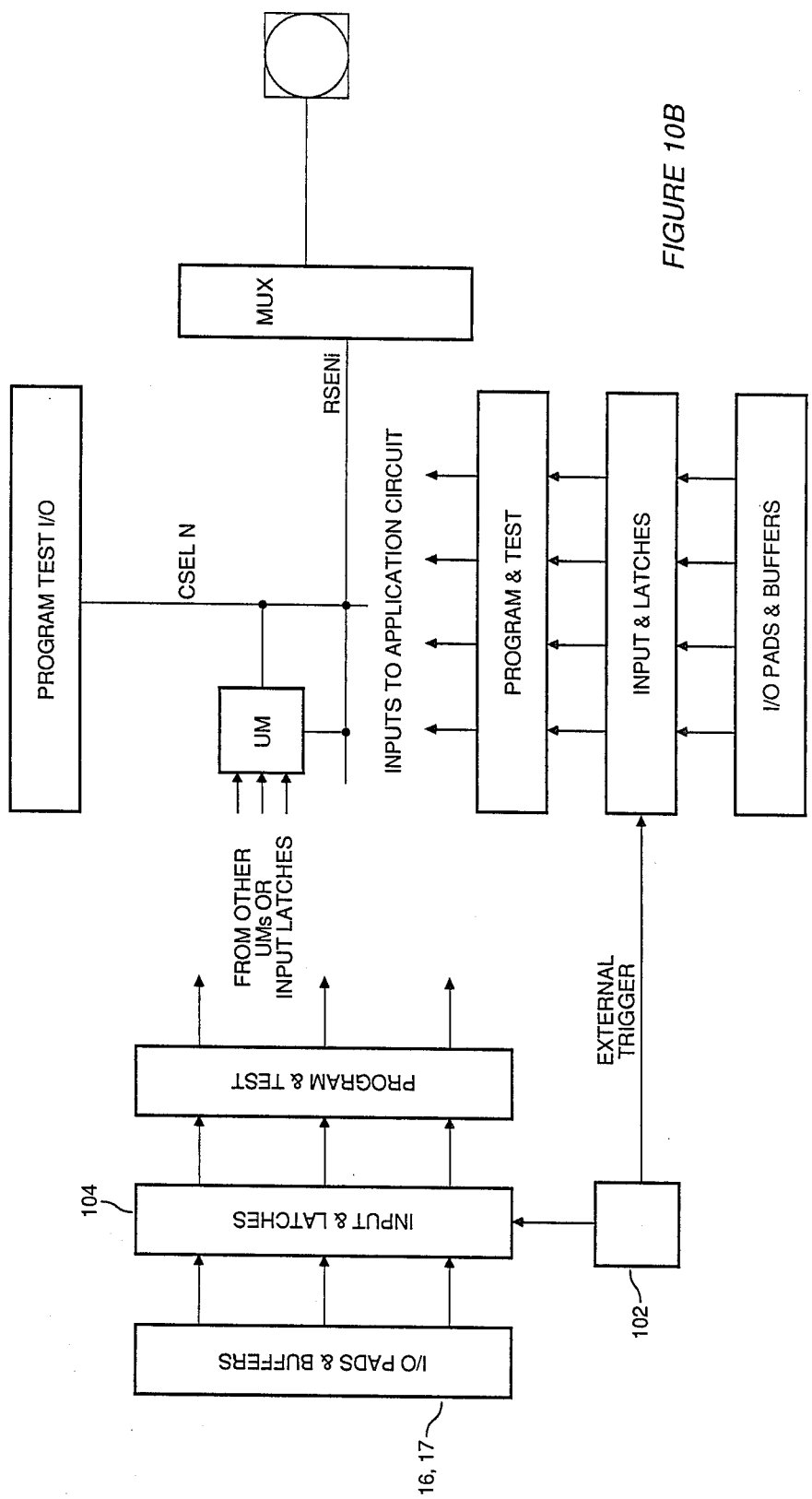
FIG. 10b illustrates the operation of the capture mode of diagnosis.

Column 11, line 4, replace "FIG. 10.a" with --FIG. 10a--.

Column 12, line 18, replace "bidirectional" with --bi-directional--.

Column 12, line 55, replace "intersection" with --intersecting--.

Column 12, line 58, replace "bidirectional" with --bi-directional--.

Column 13, line 1, replace "ther" with --the--.

Column 13, line 5, replace "equvalent" with --equivalent--.

Column 15, line 16, replace "bidirectional" with --bi-directional--.

Column 15, line 16, replace "low-impedane" with --low-impedance--.

Column 16, line 23, after "cause" delete --a--.

UNITED STATES PATENT AND TRADEMARK OFFICE
CERTIFICATE OF CORRECTION

Page 3 of 8

PATENT NO. : 4,758,745
DATED : July 19, 1988
INVENTOR(S) : Abbas A. El Gamal, Khaled A. El-Ayat, Amr Mohsen It is certified that error appears in the above-indentified patent and that said Letters Patent is hereby corrected as shown below:

In the drawings, Fig. 1B should appear as follows:

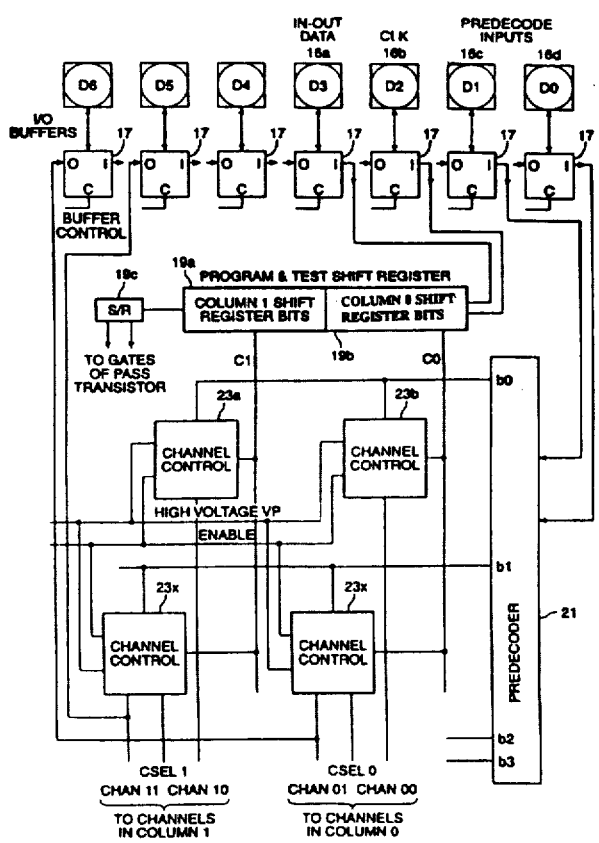

FIGURE 1B

UNITED STATES PATENT AND TRADEMARK OFFICE
CERTIFICATE OF CORRECTION

PATENT NO. : 4,758,745
DATED : July 19, 1988
INVENTOR(S) : Abbas A. El Gamal, Khaled A. El-Ayat, Amr Mohsen It is certified that error appears in the above-indentified patent and that said Letters Patent is hereby corrected as shown below:

In the drawings, Fig. 2A should appear as follows:

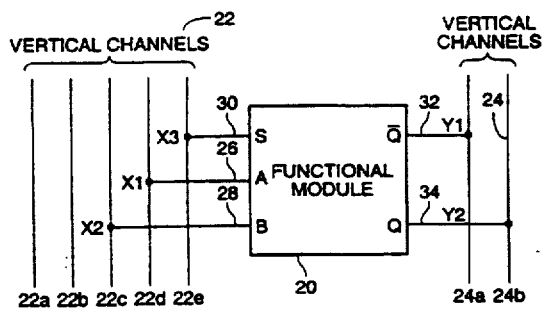

FIGURE 2A

UNITED STATES PATENT AND TRADEMARK OFFICE
CERTIFICATE OF CORRECTION

Page 5 of 8

PATENT NO. : 4,758,745
DATED : July 19, 1988
INVENTOR(S) : Abbas A. El Gamal, Khaled A. El-Ayat, Amr Mohsen It is certified that error appears in the above-indentified patent and that said Letters Patent is hereby corrected as shown below:

In the drawings, Fig. 4 should appear as follows:

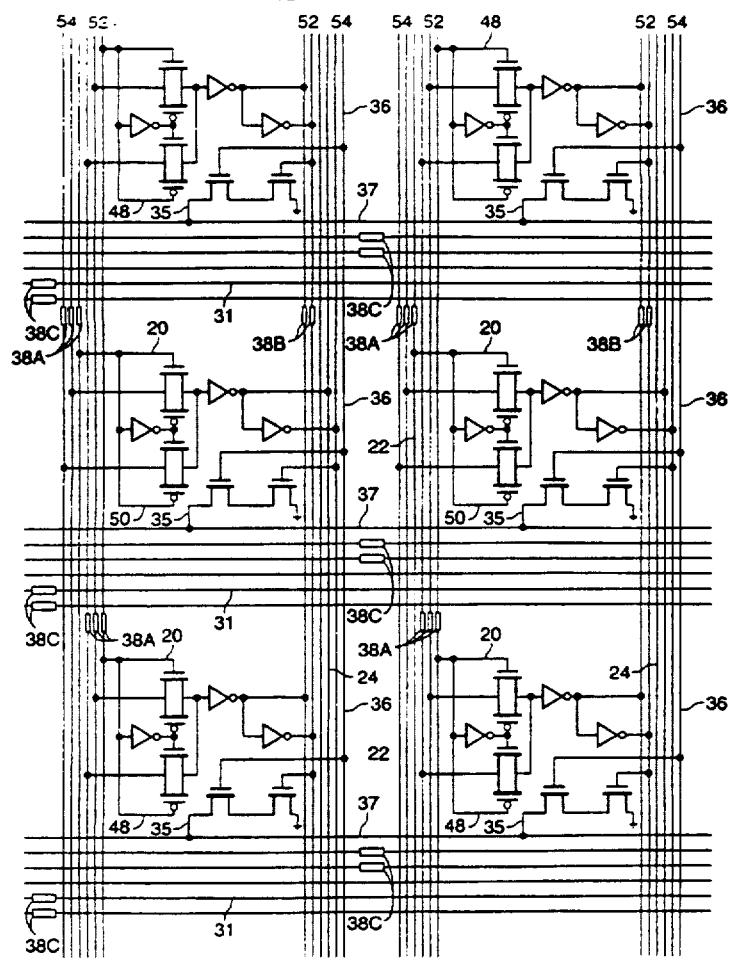

FIGURE 4

UNITED STATES PATENT AND TRADEMARK OFFICE
CERTIFICATE OF CORRECTION

Page 6 of 8

PATENT NO. : 4,758,745

DATED : July 19, 1988

INVENTOR(S) : Abbas A. El Gamal, Khaled A. El-Ayat, Amr Mohsen

It is certified that error appears in the above-indentified patent and that said Letters Patent is hereby corrected as shown below:

In the drawings, Fig. 6 should appear as follows:

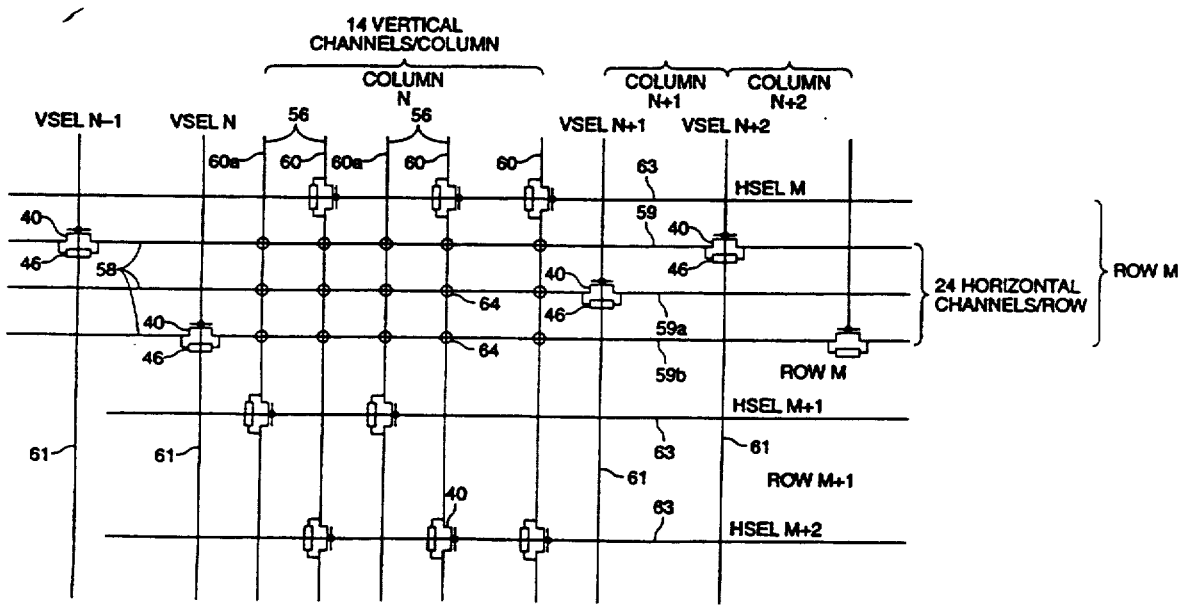

FIGURE 6

UNITED STATES PATENT AND TRADEMARK OFFICE
CERTIFICATE OF CORRECTION

PATENT NO. : 4,758,745

DATED : July 19, 1988

INVENTOR(S) : Abbas A. El Gamal, Khaled A. El-Ayat, Amr Mohsen

It is certified that error appears in the above-indentified patent and that said Letters Patent is hereby corrected as shown below:

In the drawings, Fig. 7D should appear as follows:

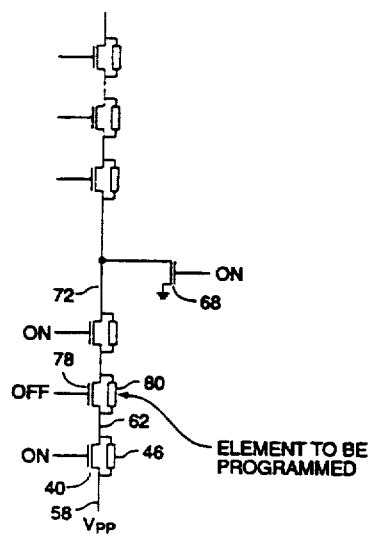

FIGURE 7D

UNITED STATES PATENT AND TRADEMARK OFFICE
CERTIFICATE OF CORRECTION

Page 8 of 8

PATENT NO. : 4,758,745
DATED : July 19, 1988
INVENTOR(S) : Abbas A. El Garal, Khaled A. El-Ayat, Amr Mohsen.

It is certified that error appears in the above-indentified patent and that said Letters Patent is hereby corrected as shown below:

In the drawings, Fig. 10B should appear as follows:

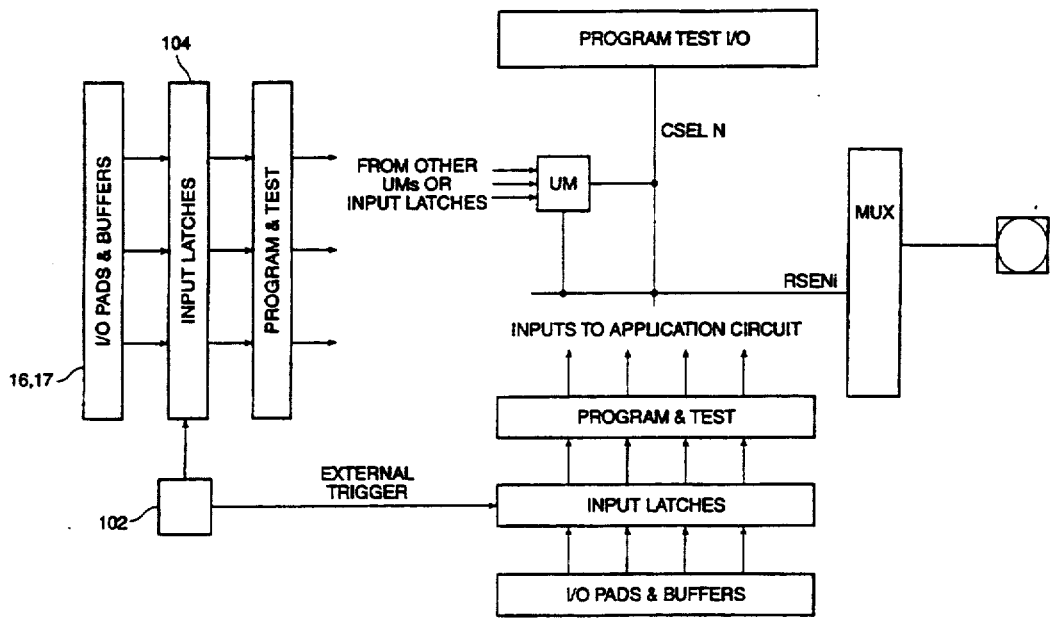

FIGURE 10B

REEXAMINATION CERTIFICATE (2429th)
United States Patent [19]
Elgamal et al.

[11] B1 4,758,745
[45] Certificate Issued Nov. 15, 1994

[54] USER PROGRAMMABLE INTEGRATED CIRCUIT INTERCONNECT ARCHITECTURE AND TEST METHOD

[75] Inventors: Abbas Elgamal, Palo Alto; Khaled A. El-Ayat, Cupertino; Amr Mohsen, Saratoga, all of Calif.

[73] Assignee: Actel Corporation, Sunnyvale, Calif.

Reexamination Requests:
No. 90/003,274, Dec. 15, 1993
No. 90/003,413, Apr. 19, 1994

Reexamination Certificate for:
Patent No.: 4,758,745
Issued: Jul. 19, 1988
Appl. No.: 909,261
Filed: Sep. 19, 1986

[51] Int. Cl.$^5$ .................................. H03K 17/693
[52] U.S. Cl. ........................ 307/465; 307/468; 307/584; 340/825.84; 340/825.91
[58] Field of Search ............ 307/202.1, 465–469, 307/443, 446; 340/825.83, 825.84, 825.91

[56] References Cited

U.S. PATENT DOCUMENTS

| | | |
|---|---|---|
| 3,106,698 | 10/1963 | Unger . |
| 3,287,702 | 11/1966 | Borck, Jr. et al. . |
| 3,287,703 | 11/1966 | Slotnick . |
| 3,473,160 | 10/1969 | Wahlstrom . |
| 3,634,927 | 1/1972 | Neale et al. . |
| 3,816,725 | 6/1974 | Greer . |
| 3,818,452 | 6/1974 | Greer . |
| 3,849,638 | 11/1974 | Greer . |
| 3,987,287 | 10/1976 | Cox et al. . |
| 4,240,094 | 12/1980 | Mader et al. . |
| 4,293,783 | 10/1981 | Patil . |
| 4,307,379 | 12/1981 | Wyland . |
| 4,409,499 | 10/1983 | Zapisek et al. . |
| 4,414,547 | 11/1983 | Knapp et al. . |
| 4,442,507 | 4/1984 | Roesner . |
| 4,458,297 | 7/1984 | Stopper et al. . |
| 4,499,557 | 2/1985 | Holmberg et al. .......... 365/163 |
| 4,513,307 | 4/1985 | Brown . |
| 4,541,067 | 9/1985 | Whitaker . |
| 4,545,111 | 10/1985 | Johnson . |
| 4,569,120 | 2/1986 | Stacy et al. . |
| 4,569,121 | 2/1986 | Lim et al. . |
| 4,590,589 | 5/1986 | Gerzberg . |
| 4,597,162 | 7/1986 | Johnson et al. . |
| 4,599,705 | 7/1986 | Holmberg et al. . |
| 4,609,830 | 9/1986 | Brandman ................. 307/202.1 |
| 4,646,266 | 2/1987 | Ovshinsky et al. . |

OTHER PUBLICATIONS

Raffel et al, "A Water–Scale Digital Integrator Using Restructurable VLSI", *IEEE J.S.S.C.*, vol. SC–20, No. 1, Feb. 1985, pp. 399–406.

An Associative Logic Matrix; Journal of Solid State Circuits; vol. SC–11, No. 5, Oct. 1976 pp. 679–691; by D. L. Greer.

On The Use of Nonvolatile Programmable Links for Restructurable VLSI; Jan. 1979 Caltech Conference on VLSI–pp. 95–104 by J. I. Raffel.

A Programmable Logic Approach for VLSI; IEEE Transactions on Computers vol. c–28, No. 9 Sep. 1979 pp. 594–601 by S. Patil & T. Welch.

A High Density Programmable Logic Array Chip; IEEE Transactions on Computers, vol. C–28, No. 9, Sep. 1979 pp. 602–608 by R. Wood.

An Electrically Alterable PLA for Fast Turnaround–Time VLSI Development Hardware; IEEE Journal of Solid State Circuits vol. SC=−15 No. 5, Oct. 1981, pp. 570–577.

A VLSI Architecture for Sound Synthesis; Department of Computer Science California Institute of Technology, 5158:TR84, Oct. 10, 1984 by J. Wawrzynek and C. Mead.

Restructurable VLSI Program of MIT Lincoln Laboratories; Semi-annual Technical Summary Report to the Defense Advanced Research Projects Agency by A. H. Anderson Jan. 20, 1981.

Restructurable VLSI Program of MIT Lincoln Laboratories; Semi-annual Technical Summary Report to the Defense Advanced Research Projects Agency Oct. 14, 1991 by P. Blankenship.

Restructurable VLSI Program of MIT Lincoln Laboratories Semi-annual Technical Summary Report to the Defense Advanced Research Agency Jan. 14, 1982 by P. Blankenship.

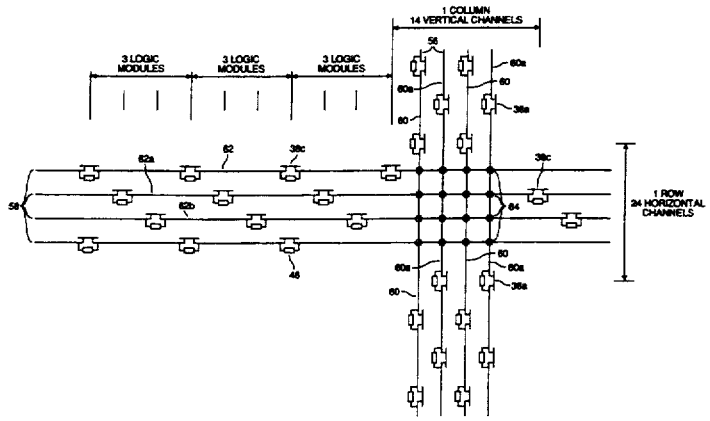

Restructurable VLSI Program of MIT Lincoln Laboratories, Semi-annual Technical Summary Report to the Defense Advanced Research Projects Agency Aug. 16, 1982, by P. Blankenship.

Restructurable VLSI Program of MIT Lincoln Laboratories; Semi-annual Report to the Defense Advanced Research Projects Agency Jan. 12, 1983 by P. Blankenship.

Laser Programmed Vias for Restructurable VLSI; International electron Devices Meeting 1980 pp. 132–135 by J. I. Raffel; M. L. Naiman, R. L. Burke, G. H. Chapman and P. G. Gottschalk.

A Demonstration of very large area integration using Restructurable Laser Links; IEEE ISSCC 1982 by J. I. Raffel, G. H. Chapman, K. H. Konkle and A. M. Soares.

Restructurable VLSI, Redundancy Workshop, IEEE Solid-State Circuits and Technology Committee May 5, 1982 by A. H. Anderson.

Restructurable VLSI Using Laser Cutting and Linking; SPIE/LA'1983 Jan. 17–21, 83 by J. I. Raffel.

Laser Formed Connections Using Polyimide; Applied Physics Letter, vol. 42, No. 8 (Apr. 15, 1983) pp. 705-706 by J. I. Raffel, J. F. Freidin & G. H. Chapman.

A Demonstration of Very Large Area Integration Using Laser Restructuring IEEE 1983 International Symposium on Circuits and Systems Proceedings May 1983 by J. I. Raffel, A. H. Anderson, G. H. Chapman, S. L. Garverick, K. H. Konkle, B. Mathur and A. M. Soares.

A Single Wafer 16-Point 16-MHZ FFT Processor; IEEE Proceedings of the Custom Integrated Circuits Conference, May 1983 by S. L. Garverick & E. A. Pierce.

A demonstration of very large area integration using laser restructuring; International Symposium on Circuits and Systems, May 2–May 4, 1983 pp. 781–784 by J. I. Raffel, A. H. Anderson G. C. Chapman S. L. Garverick, K. H. Konkle, B. Mathur and A. M. Soares.

Assignment and Linking Software for Restructurable VLSI; IEEE 1983 Custom Integrated Circuits Conference of May 23–25, 1983 by L. S. Garverick & E. A. Pierce.

Interconnection and Testing of a Wafer-Scale circuit with Laser Processing; Digest of Technical Papers of the Conference on Laser and Electro-Optics of Jun. 19–22, 1984 p. 222 by G. H. Chapman, A. H. Anderson, K. H. Konkle, B. Mathur, J. I. Raffel and A. M. Shores.

A Wafer-Scale Digital Integrator; IEEE International Conference on Computer Design-VLSI in Computers 1984, pp. 121–126; by J. I. Raffel A. H. Anderson, G. H. Chapman, K. H. Konkle B. Mathur, A. M. Soares and P. W. Wyatt.

Process Considerations in Restructurable VLSI for Wafer-Scale Integration; Technical Digest of the International Electron Devices Meeting 1984 pp. 626–629 by P. W. Wyatt, J. I. Raffel, G. H. Chapman, B. Mathur J. A. Burns & T. O. Herndon.

A Wafer-Scale Digital Integrator Using Restructurable VLSI; IEEE Journal of Solid-State Circuits, fe. 1985 vo. SC-20 pp. 399–406 by J. I. Raffel, A. H. Anderson, G. H. Chapman, K. H. Konkle, B. Mathur, A. M. Soares and P. W. Wyatt.

A specialized Silicon compiler and programmable Chip for Language Recognition, VLSI Electronics Microstructure Science, vol. 14, p. 139, 1986 Michael J. Foster.

Fault Diagnosis of Switches in Wafer-Scale Arrays ICCAD, 1986 p. 292, Yoon-Hwa, Donald S. Fussell and Microslaw Malek.

Large Scale Integration of MOS Complex Logic; A Layout Method I.E.E.E. Journal of Solid-state circuits, vol. SC-2, Dec. 67 p. 182 Arnold Weinberger.

A Cellular Threshold Array IEEE Transactions on Electronic Computers Oct. 67 p. 680 William H. Kautz.

Cutpoint Cellular Logic, IEEE Transactions on Electronic Computers, Dec. 1964, p. 685 by R. C. Minnick.

Cellular Interconnection Arrays, IEEE Transactions on Computers vol. C-17, No. 5 (May 1968) p. 443 by Kantz, Levitt and Waksman.

Cellular Logic-in-Memory Arrays, IEEE Transactions on Computers, vol. C-18, No. 8 (Aug. 1967) p. 719 by W. Kantz.

A Rectangular Logic Array IEEE Transaction on Computers, vol. C-21, No. 8 (Aug. 1972), p. 848 by S. B. Akers.

Microprogrammed Arrays, IEEE Transactions on Computers, vol. C-21, No. 9 (Sep. 1972), p. 974 by J. R. Jump and D. R. Fritsche.

Wafer Integrated Semiconductor Mass Memory, (Publication unknown) by W. A. Geideman, A. L. Soloman.

Wafer-Scale Integration-A Fault-Tolerant Procedure

IEEE Journal of Solid–State Circuits, vol. SC–13, No. 3, 1978 p. 339, by R. C. Aubusson and I. Catt.

A Dense Gate matrix Layout Method for MOS VLSI, IEEE Journal of Solid State Circuits, vol. SC–15, No. 4 Aug. 1980 by A. Lpez, H. Law.

Introduction to the Configurable Highly Parallel Computer Nov. 1980, Revised May 1981 by L. Snyder.

The Configurable, Highly Parallel (CHIP) Approach for Signal Processing Application proceedings of the Technical Symposium East, Society of Photo–Optical Instrumentation Engineers, 1982 by L. Snyder.

The Role of the CHiP Computer in Signal Processing, Concurrent Array Processors: Architectures and Languages, p. 170 (Publication unknown) Wafer Scale Integrateion of Parallel Processors by L. Snyder.

WASP–A Wafer-scale Systolic Processor IEEE, p. 665, 1985 Kye S. Hedlund.

Design of Switches for Self-Reconfiguring VLSI array Structures, North Holland Microprocessing and Microprogramming 14 (1984) p. 99–G. Gentile, M. G. Sami, M. Terzili.

Reconfigurable Architectures for VLSI Processing Arrays, National Computer Conference, 1983, pp. 565–Mariagiovanna Sami, Renato Stefanelli.

Sources of Failures and Yield Improvement for VLSI and Restructurable Interconnects for RVLSI and WSI Proceedings of the IEEE, vol. 72, No. 12 1984 Tulin E. Mangir.

U.S. patent application, Ser. No. 754,653, now abandoned, filed Jul. 15, 1985, entitled "Electronically Programmable Gate Array" by Erez Carmel.

Novel MOS PROM using a Highly Resistive Poly–Si Resistor IEEE Transactions on Electron Devices, vol. ED-27, No. 3, Mar. 1980, p. 51.

A New Programmable Cell Utilizing Insulator Breakdown, 1985 IEDM-85.

Systolic Architectures-A Wafer Scale Approach by Kye S. Hedlund and Lawrence Snyder IEEE 1984.

*Primary Examiner*—David R. Hudspeth

[57] ABSTRACT

A user-programmable interconnect architecture, which may be used for logic arrays for digital and analog system design, is disclosed. In one embodiment, a plurality of logic cells or modules in a matrix are connected by vertical and horizontal wiring channels. The wiring channels may in turn be programmed by the user to interconnect the various logic cells to implement the required logic function. The wiring channels comprise wiring segments connected by normally open programmable elements situated at the intersection of any two segments to be connected. Sensing circuitry and wiring may be included to allow 100% observability of internal circuit nodes, such as module outputs, from an external pad interface.

REEXAMINATION CERTIFICATE ISSUED UNDER 35 U.S.C. 307

NO AMENDMENTS HAVE BEEN MADE TO THE PATENT.

AS A RESULT OF REEXAMINATION, IT HAS BEEN DETERMINED THAT:

The patentability of claims 1-22 is confirmed.

* * * * *